US007525392B2

(12) United States Patent
Tarng

(10) Patent No.: US 7,525,392 B2
(45) Date of Patent: Apr. 28, 2009

(54) XTALCLKCHIP: TRIMMING-FREE CRYSTAL-FREE PRECISION REFERENCE CLOCK OSCILLATOR IC CHIP

(75) Inventor: Min Ming Tarng, San Jose, CA (US)

(73) Assignee: Tang System, San Jose, CA (US)

( * ) Notice: Subject to any disclaimer, the term of this patent is extended or adjusted under 35 U.S.C. 154(b) by 0 days.

(21) Appl. No.: 11/500,125

(22) Filed: Aug. 5, 2006

(65) Prior Publication Data

US 2008/0042765 A1 Feb. 21, 2008

(51) Int. Cl.
H03L 1/00 (2006.01)
H03L 7/06 (2006.01)
H03L 7/18 (2006.01)
(52) U.S. Cl. .................. 331/18; 331/16; 331/176; 331/177 V
(58) Field of Classification Search ................. 331/167, 331/176, 16, 18, 25, 74–76, 177 R, 177 V
See application file for complete search history.

(56) References Cited

U.S. PATENT DOCUMENTS

| 5,604,468 | A  | * | 2/1997  | Gillig ......................... 331/176 |
| 6,292,066 | B1 | * | 9/2001  | Shibuya et al. .............. 331/176 |
| 6,549,082 | B2 | * | 4/2003  | Ipek et al. ..................... 331/57 |
| 6,919,744 | B2 | * | 7/2005  | Paist et al. ................... 327/115 |
| 6,980,062 | B2 | * | 12/2005 | Fujita .......................... 331/176 |
| 7,223,652 | B2 | * | 5/2007  | Ooi et al. .................... 438/238 |
| 2003/0194046 | A1 | * | 10/2003 | Shirar ......................... 377/19 |
| 2007/0047689 | A1 | * | 3/2007  | Menolfi et al. .............. 375/376 |

* cited by examiner

Primary Examiner—David Mis

(57) ABSTRACT

A XtalClkChip based on the application of hierarchical circuit and noise circuit design on the RF circuits of LC oscillation tank and the multi-phase fractional PLL are developed. The XtalClkChip combines both the XtalChip and multi-phase fractional PLL to provide the customer's clock to customer directly. This XtalChip will replace the crystal and the crystal circuit. The XtalClkChip will replace all the customer's clock circuit.

20 Claims, 21 Drawing Sheets

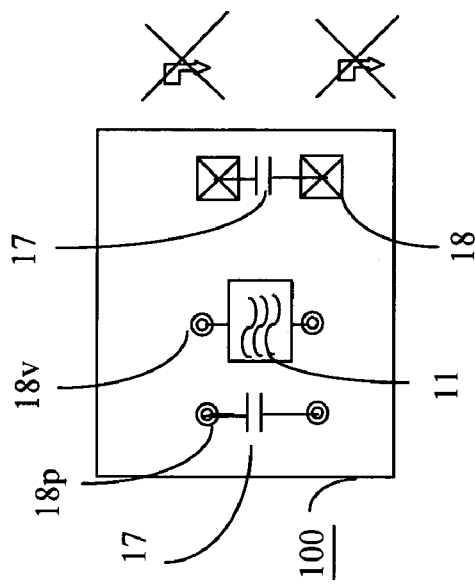
FIG.3A (Prior Art)
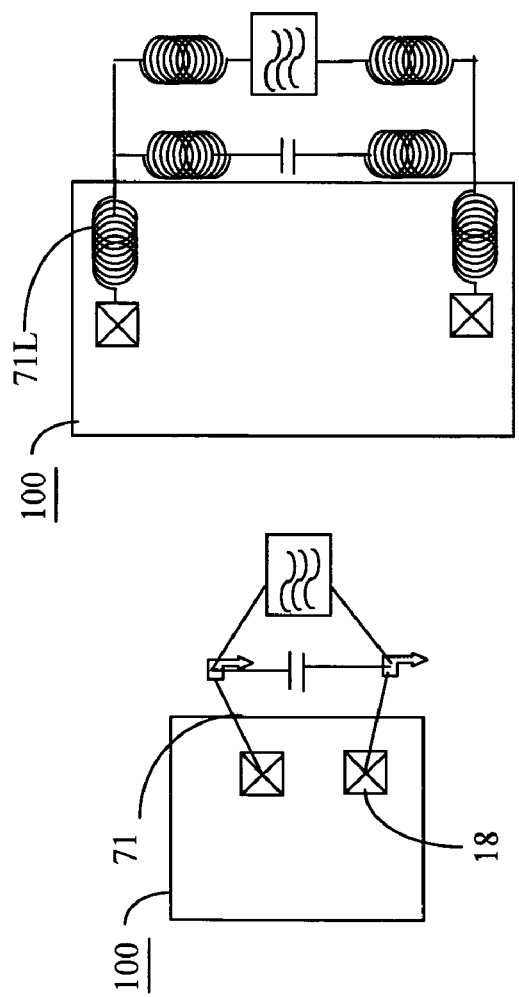
FIG.3B (Prior Art)
FIG.3C
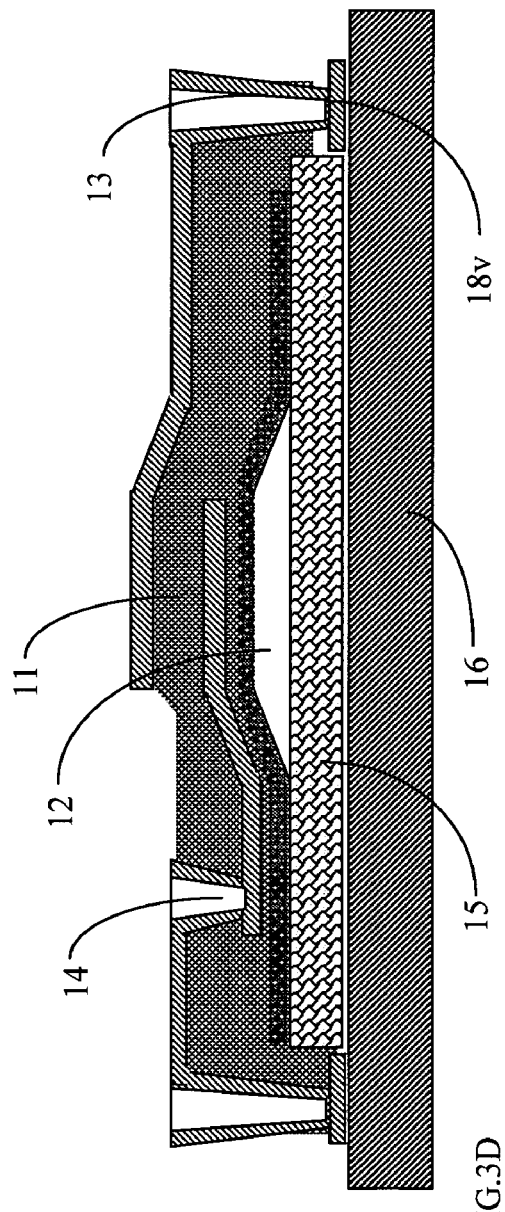
FIG.3D $$Zin = Rgyr^2 * s\,C$$

XTALCLKCHIP: TRIMMING-FREE CRYSTAL-FREE PRECISION REFERENCE CLOCK OSCILLATOR IC CHIP

BACKGROUND

Field of Invention

Both the XtalChip and XtalClkChip are the trademarks of Tang System. The XtalClkChip is the dream to replace the Crystal on the board with XtalChip. Furthermore, the Xtal-Chip can be integrated with the chip to be SOC(System On Chip). The XtalChip integrated with the clock system which comprising PLL, etc to be the XtalClkChip. However, from the system view, the XtalChip and XtalClkChip have the common resources which can be shared with each other. If the XtalClkChip has the direct access to the interior structure of the XtalChip, then the system integration will be much more realistic.

With the combination of the monolithic above-IC resonator bulk acoustic wave BAW VCO and fractional-N frequency synthesizer with randomized multiphase VCO, we have the XtalClkChip. The XtalClkChip is Trimming-Free Crystal-Free Precision Reference Clock Oscillator IC chip.

Unlike the RF LC clock generator in prior art, the XtalClkChip doesn't need to trim the bandgap voltage, flat current, capacitor in the LC tank, etc. The bandgap voltage and current vary nonlinear; capacitor varies nonlinear; inductor varies nonlinear. So many nonlinear factors work and combine together, it is impossible to use the trimming to have the compensation to be constant clock frequency.

The XtalClkChip will generate the customer's clocks directly. So, it might consider the XtalClkChip without the dividers to divide the LC tank down. Instead of dividing the LC tank down, the LC tank directly converts to the customer's clocks. From the system view point, our system saves the dividing process and eliminates the noise in the dividing process. Furthermore, the customer saves the PLL. The XtalClkChip is to get rid of the Crystal, crystal clock circuit and the PLL circuit with the high frequency direct conversion to other frequencies without the dividing the high frequency oscillation to low frequency clock.

OBJECTS AND ADVANTAGES

The XtalClkChip is the trimming-free crystal-free precision reference clock oscillator IC chip. Without any trimming, the XtalClkChip can provide the customer-specific reference clock and application-specific clocks to the customer. It saves the customer's crystal, crystal circuit and PLLs circuit.

From low end to high end XtalClkChips, the inductor can be bonding wire, on-chip inductors, gyrator and BAW, etc.

In the XtalClkChip design, the most advanced circuit design methodology of the hierarchical circuit design is applied to the noise design discipline of the circuit design. With the distributed embedded LDVRs, all the modules of the XtalClkChip are isolated from each other that the LCO pulling is minimized. The external disturbance of the LCO is minimized that the LCO frequency is crystal clean.

Furthermore, the XtalClkChip can be integrated as IP that the external crystal and pins are completely eliminated. It increases the system performance and reduces the system cost.

DRAWINGS FIGURES

FIG. 11 This is the analog system design of LDVR. (A) is the schematics of low noise, external-capacitor-free Low Drop Voltage Regulator (LDVR) for low frequency and high Giga Hz frequency range power supply and noise isolation; (B) is the schematics of the low noise, external-capacitor-free Low Drop Voltage Regulator (LDVR) for low frequency and Meg Hz frequency range power supply and noise isolation; (C) is the model of the idealized LDVR; (D) is the power noise and the smart sampling strategy for the switch capacitor noise filter; this is hierarchical circuit design with the digital/logic circuit embedded in the switch capacitor and analog circuit; it is not the analog circuit at all; (E) is the gain diagram of the conventional flat circuit design with the pure analog circuit of the LDVR with the external capacitor; (F) is the gain diagram of the hierarchical circuit design with the digital/logic and smart sampling switch capacitor embedded in the analog circuit of the LDVR as shown in FIG. 11A.

Figure 12A:
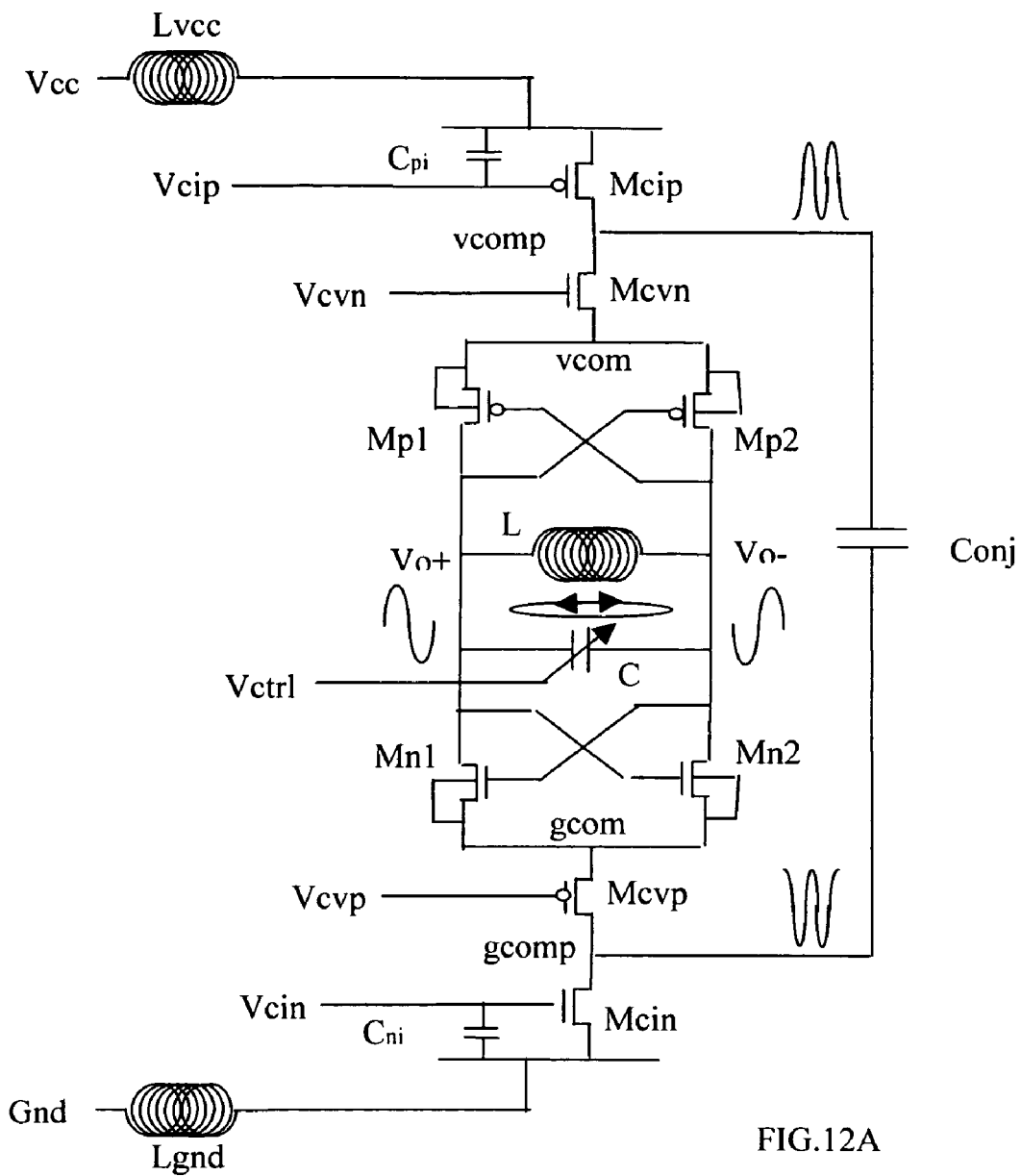

FIG. 12(A) is the schematic of LC oscillator with the embedded LDVR mechanism having quenching effect on the power and ground noise; (B) is the output oscillation of the conventional LCO; (C) is the logic/digital circuit can have the same embedded LDVR structure to supply the power and have the noise isolation.

FIG. 13 is the schematic of programmable LNA for the high frequency direct input of clock signal. (A) is the basic single end LNA having the programmable gain capability; (B) is the low noise differential end programmable gain LNA (PGLNA).

Figure 14:
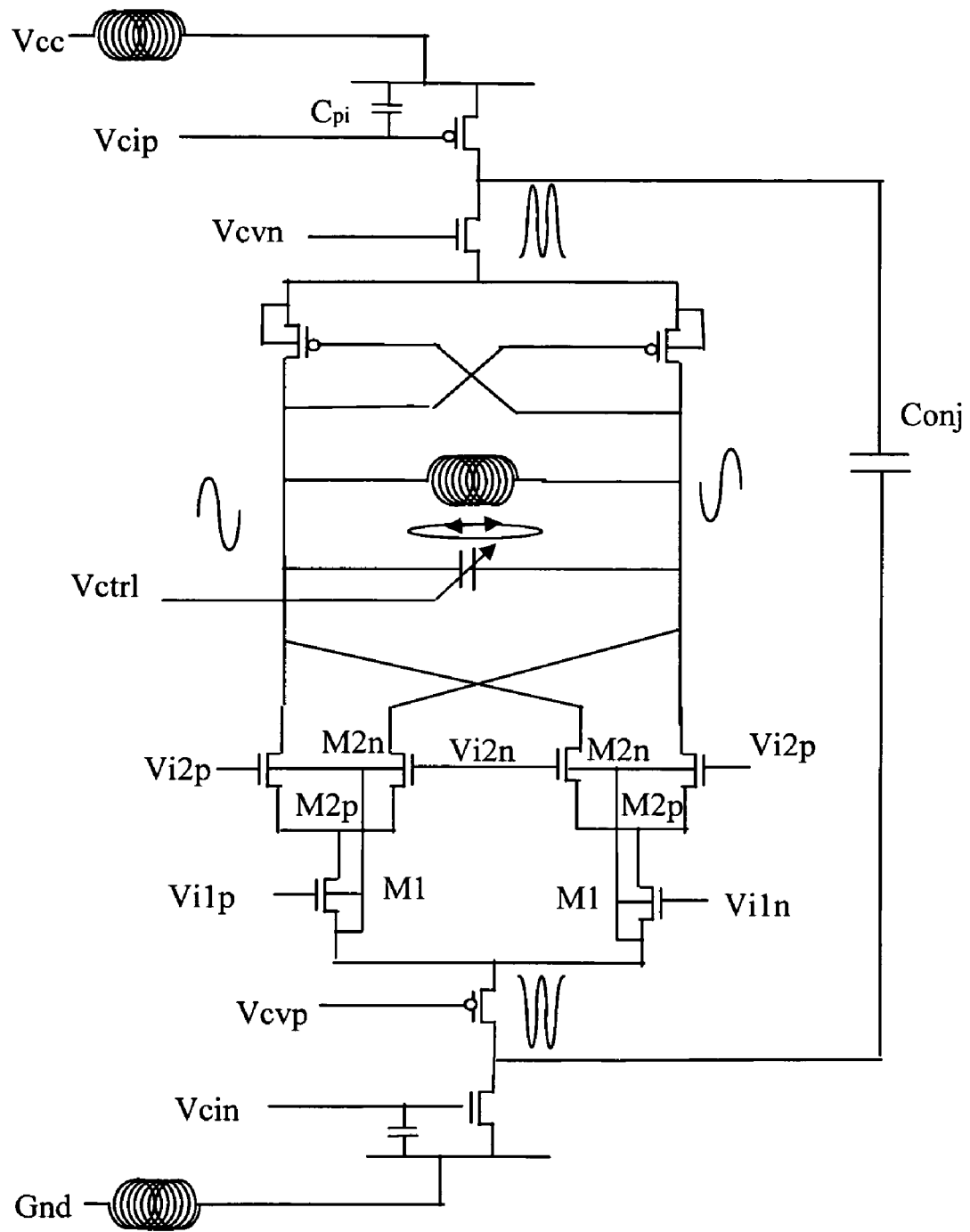

FIG. 14 is the schematic of programmable filtering mixer with the embedded LDVR mechanism having the quenching effect on the self-generated mixer noise.

Figure 15:
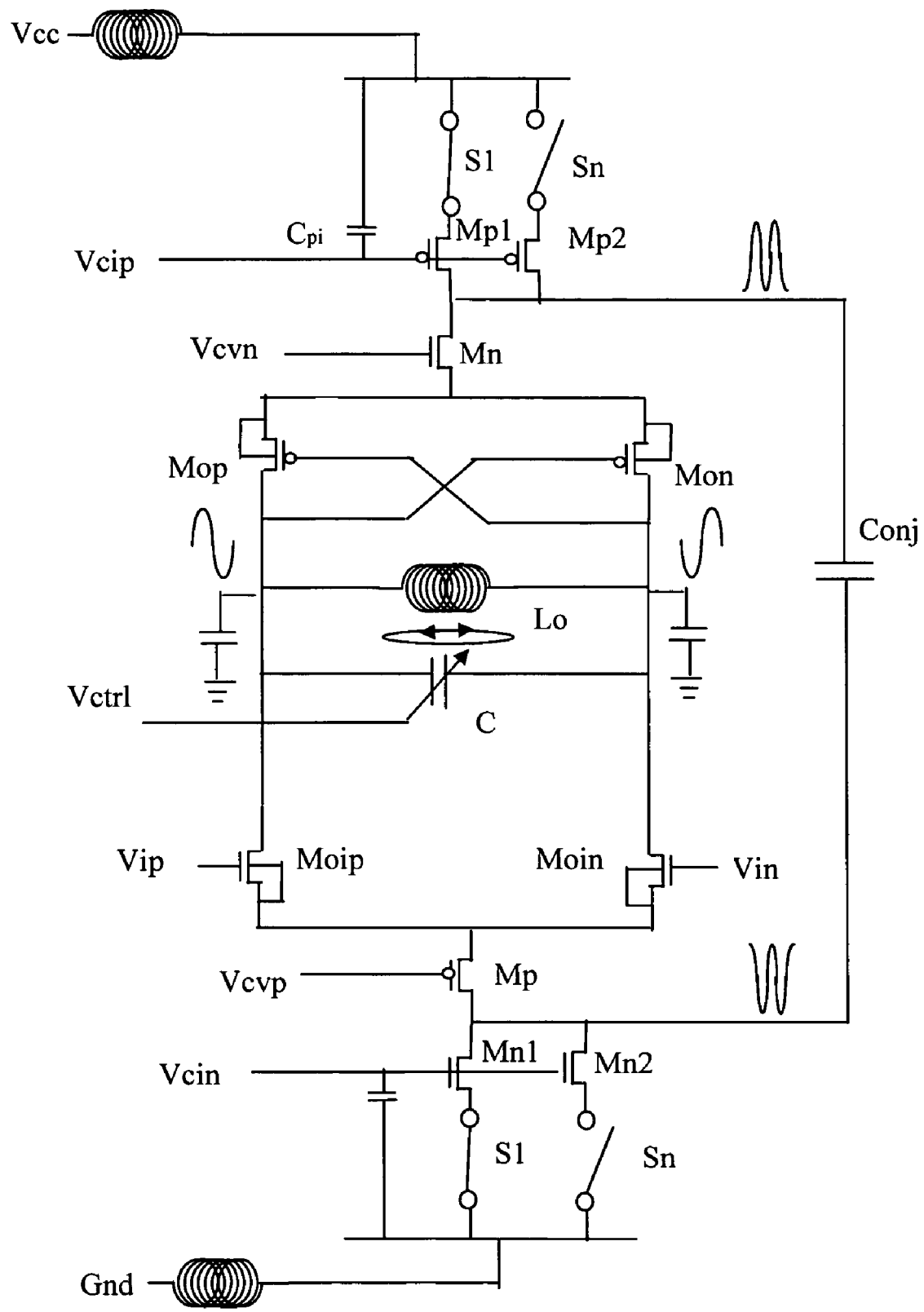

FIG. 15 is the schematic of programmable output driver of buffer with the embedded LDVR mechanism having quenching effect on the self-generated noise.

Figures 16A, 16B:
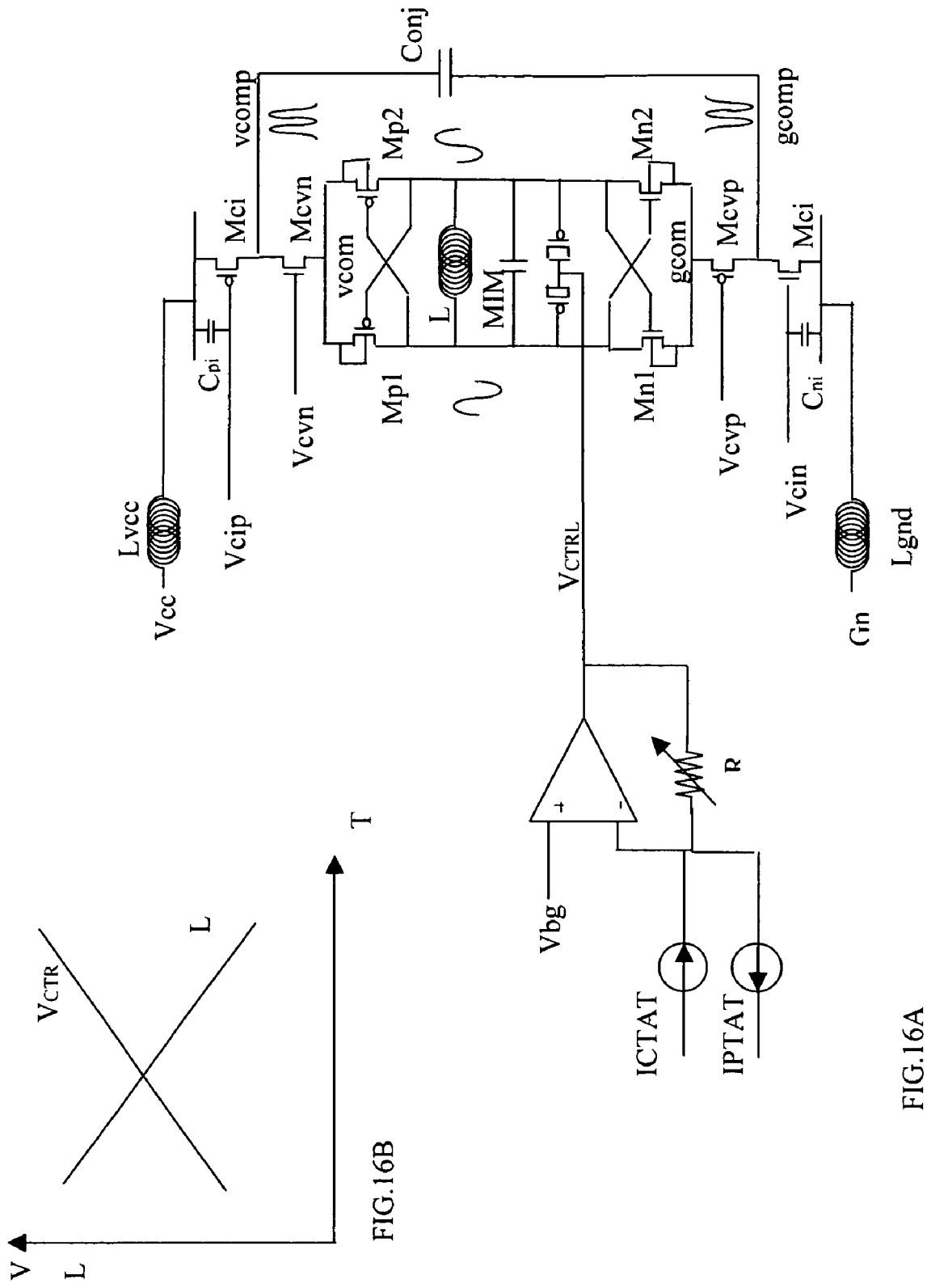

FIG. 16(A) is the direct analog compensation for the L over temperature variation in the LC tank without the A/D and digital control, etc.; (B) is the principle of the direct analog compensation for the L in the LC tank over temperature variation.

DESCRIPTION AND OPERATION

In the conventional clock generator, the crystal oscillator is used to generate the reference clock. However, the crystal oscillator is a mechanical oscillator of the crystal lattice. The oscillation frequency of crystal oscillator is lower that it needs the PLL to boost up the frequency. At the age of crystal clock generator, the LC oscillator has no frequency accuracy. It cannot use the LC oscillator to be the reference frequency.

Now, our invention is to have the frequency accurate LC oscillator to generate reference clock. The frequency accurate LC oscillator reference clock generator has the very high frequency. Then use the PLL to divide down to generate the user's output clock directly. The LC oscillator is to replace the crystal oscillator to be the frequency reference generator.

The clean power requirement of the XtalClkChip is very high. For the chip having the dirty power, it is impossible to implement the XtalClkChip. To have the clean power for the XtalClkChip of Xtaless Clock generator, the hierarchical circuit means has to adopt to implement the XtalClkChip.

There are many way to implement the XtalClkChip. We make the innovation in the implementation of the XtalClkChip in the way of hierarchical circuit design style. Formally, the hierarchical design is only applied to the digital/logic circuit. Now, we extend the hierarchical design style to the analog circuit to design the XtalClkChip. To have the separation of the phase error and the frequency error in PLL, the larger the capacitor in the low pass loop filter the better. The big capacitor is, for the same RC bandwidth, the small R can be. The impulse of the charge pumping dies away fast. The phase adjustment of the clock is more accurate. However, due to the large capacitor, the impact on the frequency change for VCO is much smaller.

However, the capacitor area is too large for the on-chip capacitor. If use the external capacitor, the capacitor can be big capacitor. However, the inductance of the bonding wire and package will induce a lot switching noise due to the impulse of the charging pump current. It generates much more noise to the VCO.

The XtalClkChip is a clock chip. It has much higher performance specification than the conventional frequency synthesizer. To have much higher performance, the XtalClkChip has to use the larger capacitance having no inductance. So we make the innovation of the bonding capacitor. It is similar to the bonding inductor made of the bonding wire being bonded to the surface of the pads of the chip, the bonding capacitor is the capacitor made of the fringe capacitor being bonded to the surface of the pads of the chip. With the bonding capacitor, the inductance of the bonding wire and package is eliminated.

Figure 1:
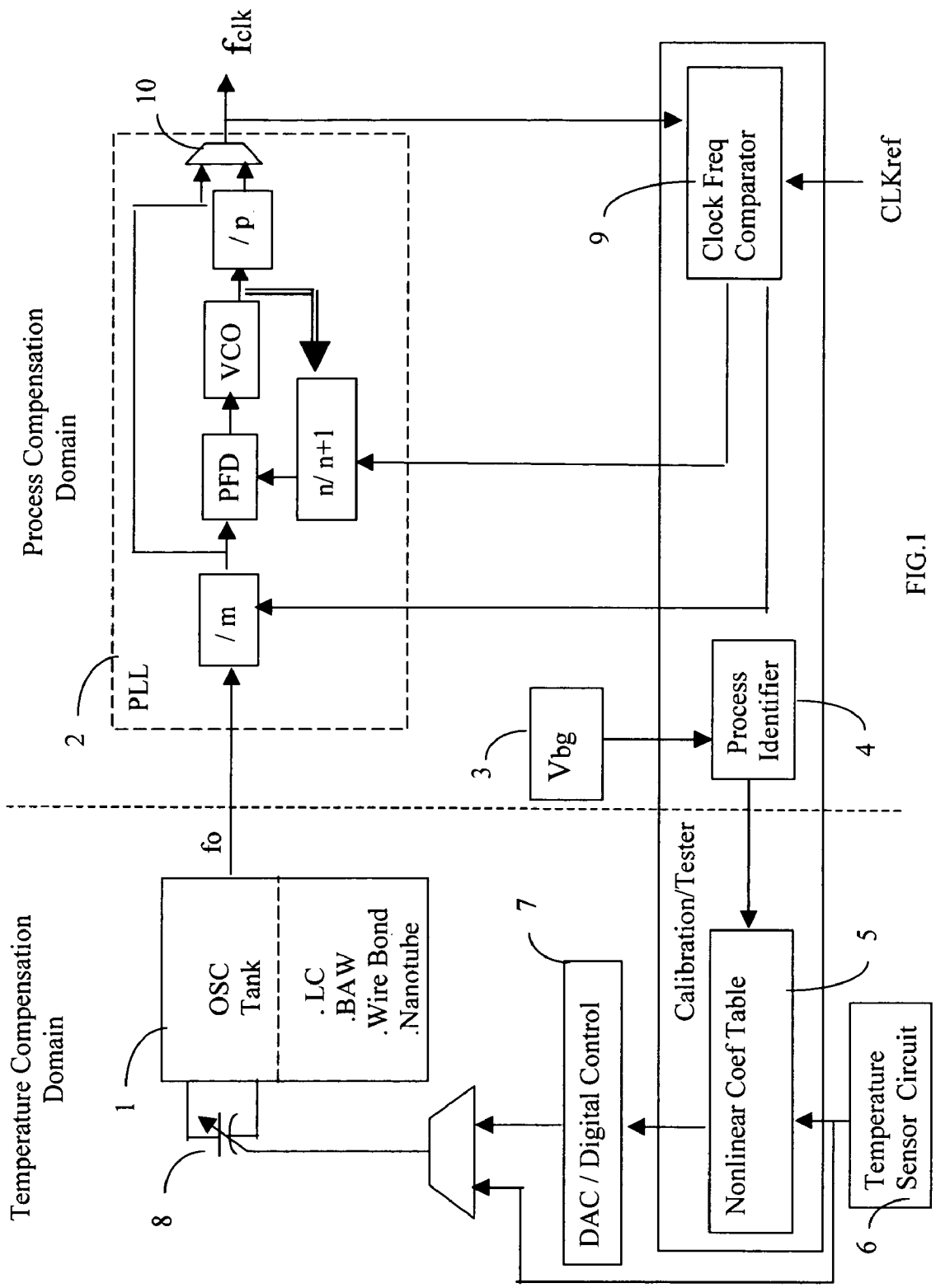
FIG. 1 is the block diagram of the Trimming-Free Crystal-Free Precision Reference Clock Oscillator IC chip.

FIG. 1 shows the XtalClkChip having the oscillator tank 1 without any external disturbance and the phase-lock loop 2 which can generate any frequency which is specified by the customers. The XtalClkChip adopts the most advanced hierarchical PVTAN (Process-Voltage-Temperature-Aging-Noise) design. In this design, we adopt the most advanced SOC IC circuit design techniques which haven't shown anywhere. Being similar to the layout having the floor plan before the place and routing, we have the noise plan and power plan before designing the individual circuit modules. Being similar to the digital circuit having the timing analysis and verification after the logic function design and verification, for the analog circuit design, we have the noise analysis and verification after the analog function design and verification. In the SOC IC design, we use the hierarchical circuit design which is the application of the hierarchical system control theory. Instead of using the centralized LDVR, we adopt the distributed LDVR to save power and make the good isolation of noise. Furthermore, we invent the bonding capacitor package techniques to attach the high-density high capacitance fringe capacitor to the top of the IC. It saves the pin and enhance the performance of the chip.

The design principle of the XtalClkChip is to adopt the divide-and-conquer methodology to divide the PVT(process-voltage-temperature) variation to be two orthogonal domains of the temperature compensation domain and the process compensation domain. For the voltage variance of the power supply and the noise of power and ground, we design the XtalClockChip with PSRR AC testing.

Figure 2:
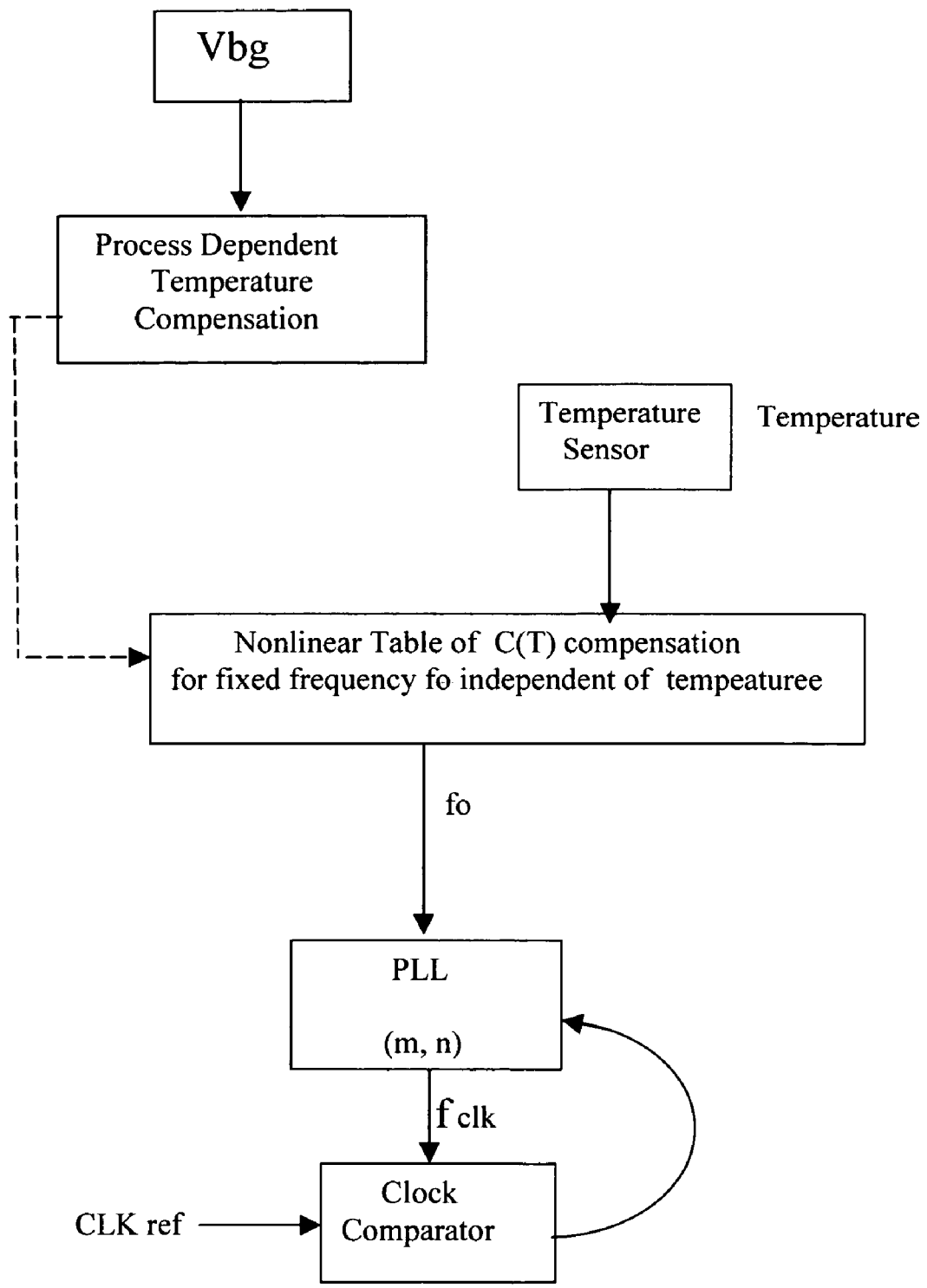
FIG. 2 is the calibration flow of the XtalClkChip.

As shown in FIG. 2, it is the calibration and testing flow of the XtalClkChip. Referring to FIG. 1 and FIG. 2, the bandgap reference voltage Vbg 3 generates the Vbg of the chip. The process identifier 4 reads out the Vbg voltage can tell what kind process (SS, TT, FF, etc) of the XtalClkChip is, where S is slow process, T is typical process and F is the fast process.

After the process of the XtalClkChip is identified, the nonlinear coefficient table 5 is loaded into the XtalClockChip. The temperature sensor circuit 6 is to sense the temperature of the XtalClockChip. According to the temperature of the XtalClkChip, the proper nonlinear coefficient is selected and the value is sent to the DAC or digital control 7 to control the capacitor 8 of the oscillator tank 1 to generate the fixed oscillation frequency fo. Since the oscillation tank 1 has no external disturbance, so it is very stable in its output oscillation frequency fo.

No matter how, our XtalClkChip has much better quality and flexibility for the customer than the conventional dividing the oscillation tank oscillation frequency $f_o$ down to 24 MHz then boost with customer's own PLL. The less signal processes to the final customer's clock, the better the signal quality is. From the whole system view, the XtalClkChip can generate the output directly for the customer, the clock performance will be much better than the divide the clock 1 GHz to be 24 MHz, and then the customer boosts the clock up with the PLLs to be the customer's clocks. In any case, no matter how, the PLL does need between the oscillator tank 1 and the customer clocks.

So, we have one on-chip fractional PLL 1 to convert the oscillation in GHz ranges to be the customer's specified clock. Adjusting the programmable variable m, n/n+1 and p, the fo is divided to be the fractional value of fclk=(n.f)*(fo/m)/P where (n.f) means n digital with f fraction. As shown in FIG. 1, the output clock fclk is compared with the customer's specified input CLKref and the parameters m and n are adjusted accordingly.

For the spread-spectrum clock, it is easily to programming the parameters of the multi-phase fractional PLL to have the cyclic spread-spectrum operation. For the multi-phase fractional PLL, the spread-spectrum clock is implemented with the parameters of PLL instead of the variance the LCO oscillation tank as the other's traditional clock chip does.

There is a bypass path of the PLL. If the customer just wants to read out the clock or the clock without the PLL, the MUX 10 can be selected to bypass the PLL to read out the fo or fo/m directly.

The XtalClkChip needs high precision LC tank and capacitor to decouple the noise in the LDVR, etc. However, as shown in FIG. 3A, in the traditional chip, they use the external capacitor and inductor or filter connected through the bonding wire 71, etc. The dotted line is the chip boundary. As shown in FIG. 3B, the parasitic inductor 17L of bonding wire 17, etc deteriorates all the performance. As shown in the FIG. 3C, in our XtalClkChip, we adopt the bonding fringing capacitor, on-chip capacitor and on-chip Bulk Acoustic Wave (BAW).

Since the customer might use the fclk directly, so we provide the high quality output clock fclk. As shown in FIG. 3D, it is the top chip Bulk Acoustic Wave (BAW) device which can be integrated on the top of the silicon chip. The quality factor Q is 1,500 for the BAW device. The electrode 13 and 14 clamp a piezoelectric layer 11. The piezoelectric layer 11 is above an air gap. The piezoelectric layer 11, electrodes 13 and 14 are constituted of an MEM type inductor which can be integrated on the top of silicon isolator 15 and the silicon wafer 16.

Figure 3E:
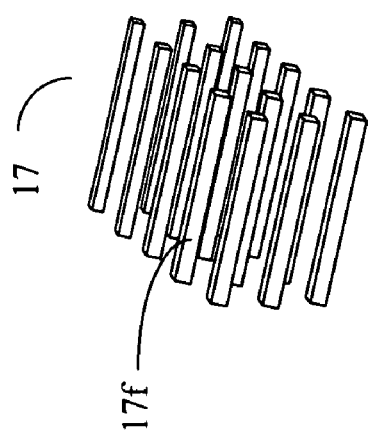
FIG. 3 is the off-chip capacitor and filter or inductor; (A) is the external capacitor and filter or inductor; (B) is the equivalent circuit of FIG. 3A; (C) is the on-chip capacitor, bonding-capacitor, and BAW filter or inductor; (D) is the cross-section of the BAW; (E) is the fringe-capacitor; (F) is the bonding-capacitor.
Figure 3F:
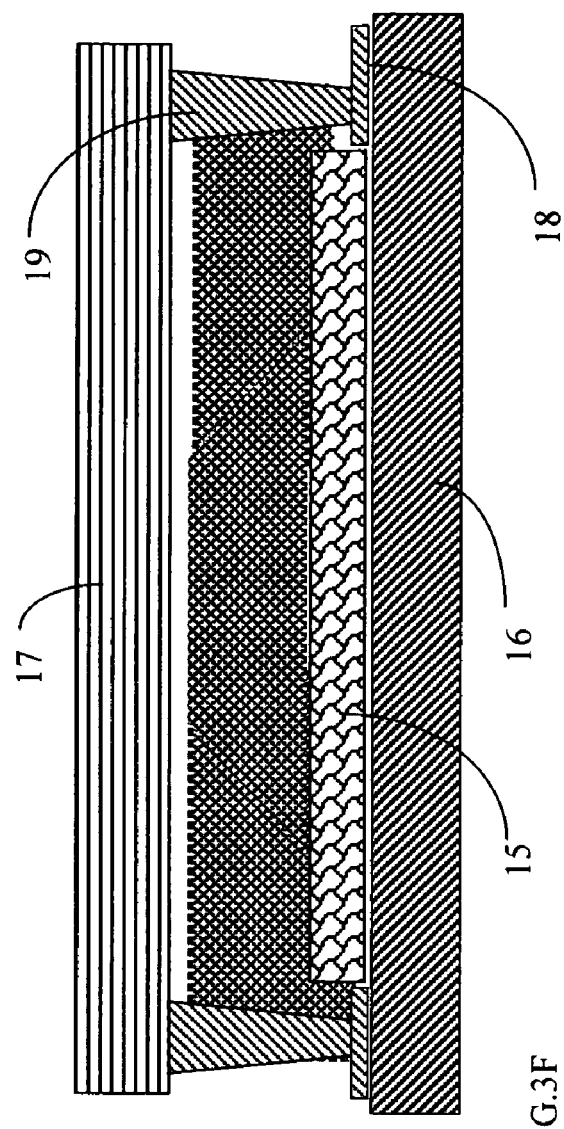

As shown in FIG. 3E, the fringe capacitor 17 has the capacitor strip 17$f$ piled up to be 3D structure. The high-density capacitor modules can be bonded to the pad 18 directly to be the bonding capacitor. The high density fringe strip fringing capacitor 17 can also bonding to any position 18$p$ over the chip as shown in FIG. 3C.

Figure 4:
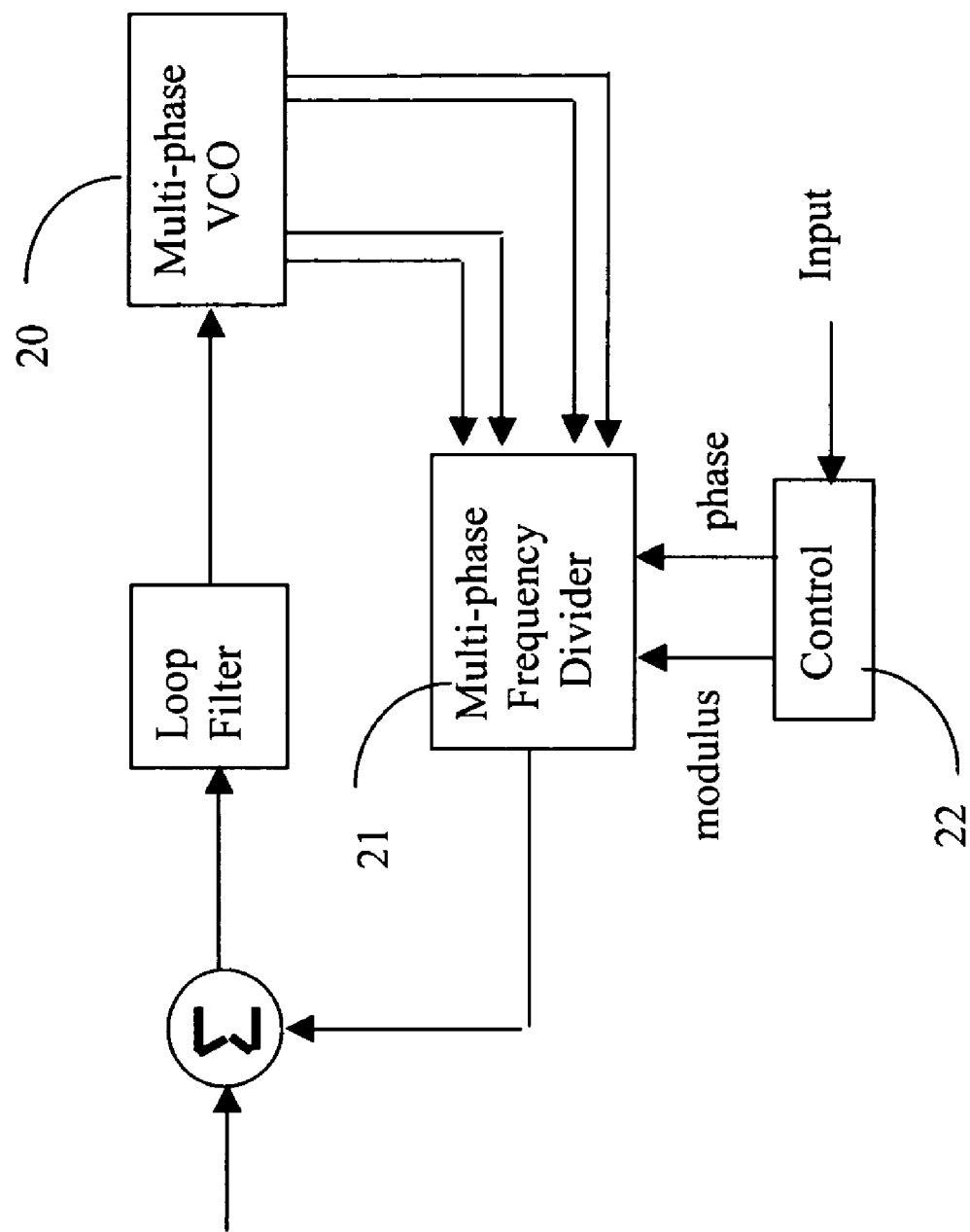
FIG. 4 is the block diagram of the multi-phase fractional-PLL.
Figure 9:
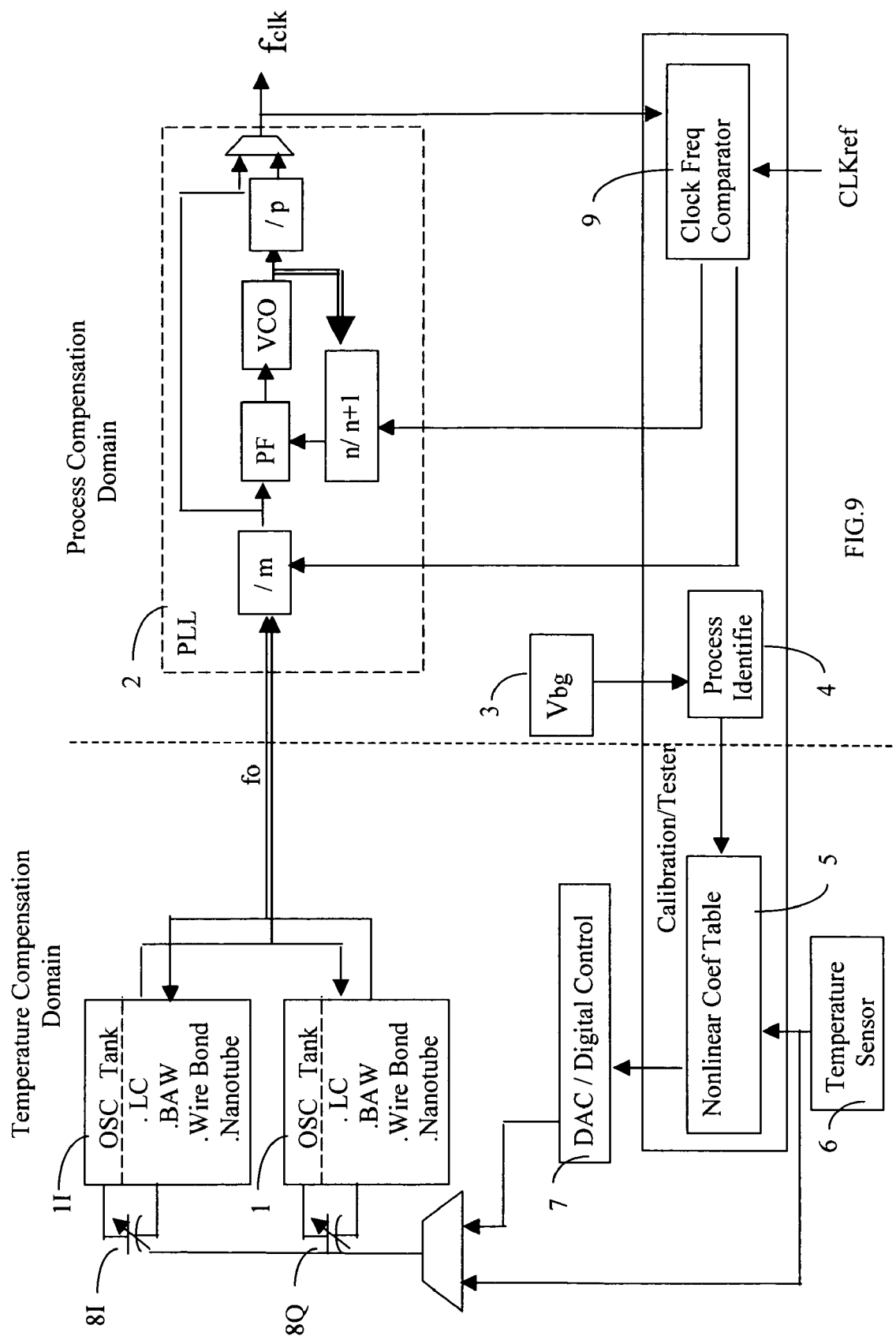
FIG. 9 is the block diagram of the XtalClkChip with the IQ oscillators to enhance the Q factor of the oscillator tank and having the quadratic phase clock for the multi-phase fractional PLL.

FIG. 4 shows the detailed block diagram of the fractional PLL. To generate the fractional PLL clock, the divider is swapping between the n and n+1 modules having the multiple phases of fractional PLL. It has 0 degrees, 90 degrees, 180 degrees, 270 degrees multiple phases. There are two ways to generate the 4 phases of clock. One way is to use the single VCO to have the two different connections of the (/2) dividers. The other way is to use the I and Q dual VCOs to generate the 4 phases clock as shown in FIG. 9. The multiple phases combines with the n/n+1 modules division will generate much more smooth transition in the factorial PLL transition. So the phase noise is much smaller.

In the XtalClkChip design, we use the most advanced hierarchical circuit design for the NPVTA design process. FIG. 12 shows the circuit implementation of the LC tank. Combining the high Q=1500 BAW LC tank and the multi-phase factorial PLL, the XtalClkChip performance will be much higher than the traditional crystal clock circuit. Now, the XtalClkChip is not to emulate and try to catch the performance of the traditional crystal clock circuit. The XtalClk-Chip has the much superior performance to the traditional crystal circuit.

Figure 5A:
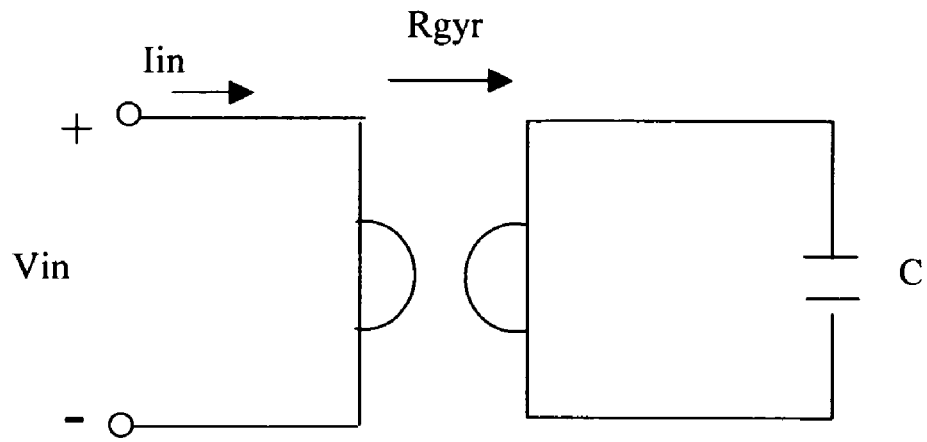
FIG. 5(A) is the inductor made of the gyrator and capacitor; (B) is the inductors made of the bonding wires; (C) is the schematics of the LCO made of the inductors of bonding wires.
Figure 5B:
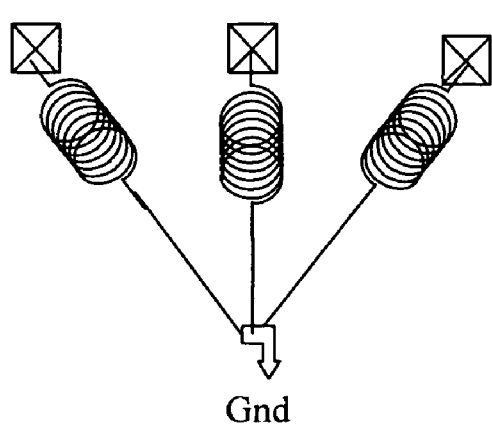
Figure 5C:
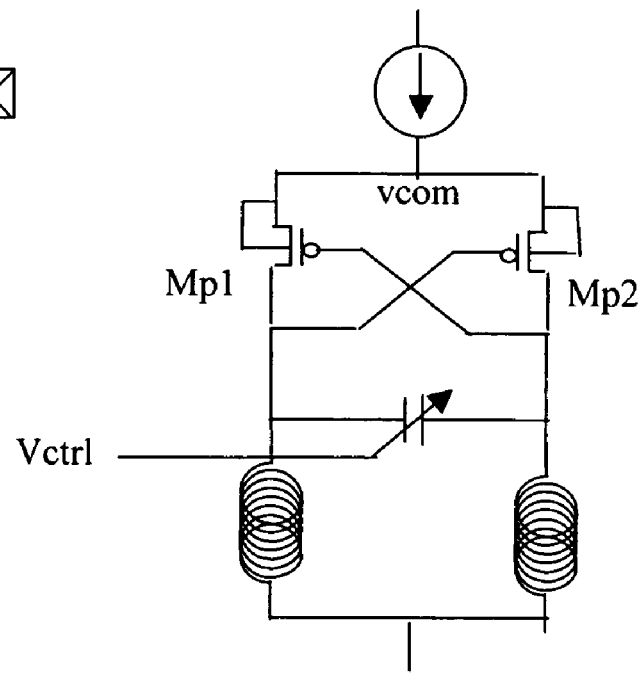

For the low performance XtalClkChip, the inductor can be replace with the gyrator and C as shown in FIG. 5A or the bonding wire as shown in FIG. 5B or nano-tube. FIG. 5C shows the LCO made of the inductors made of the bonding wires as shown in FIG. 5B.

Figure 6A:
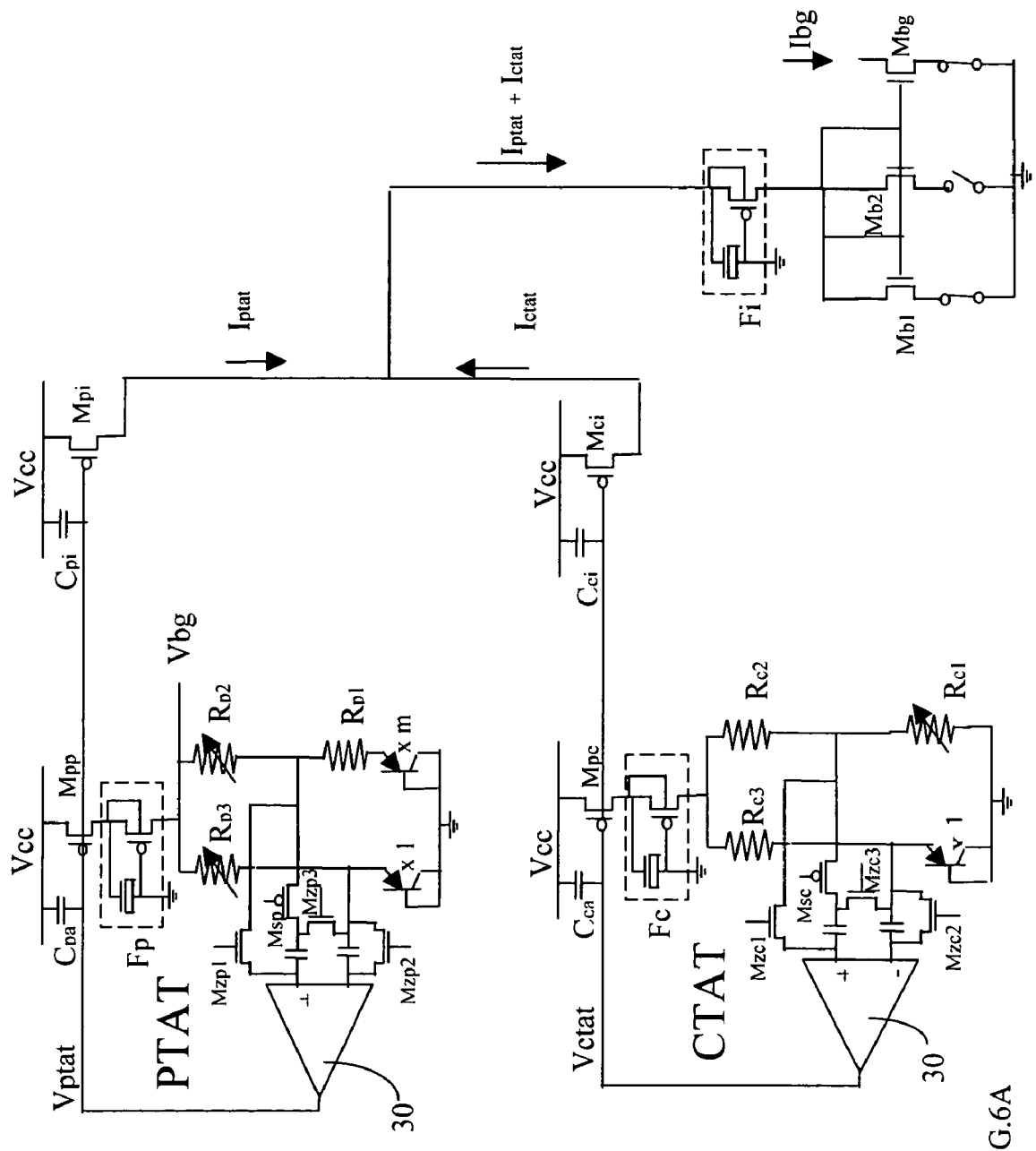
FIG. 6(A) is the schematic of the bandgap reference voltage Vbg and the bandgap reference current Ibg; (B) is the global and local partition of the hierarchical circuit design in the frequency domain; (C) is the noise design with the PSRR in the hierarchical circuit design.
Figure 6B:
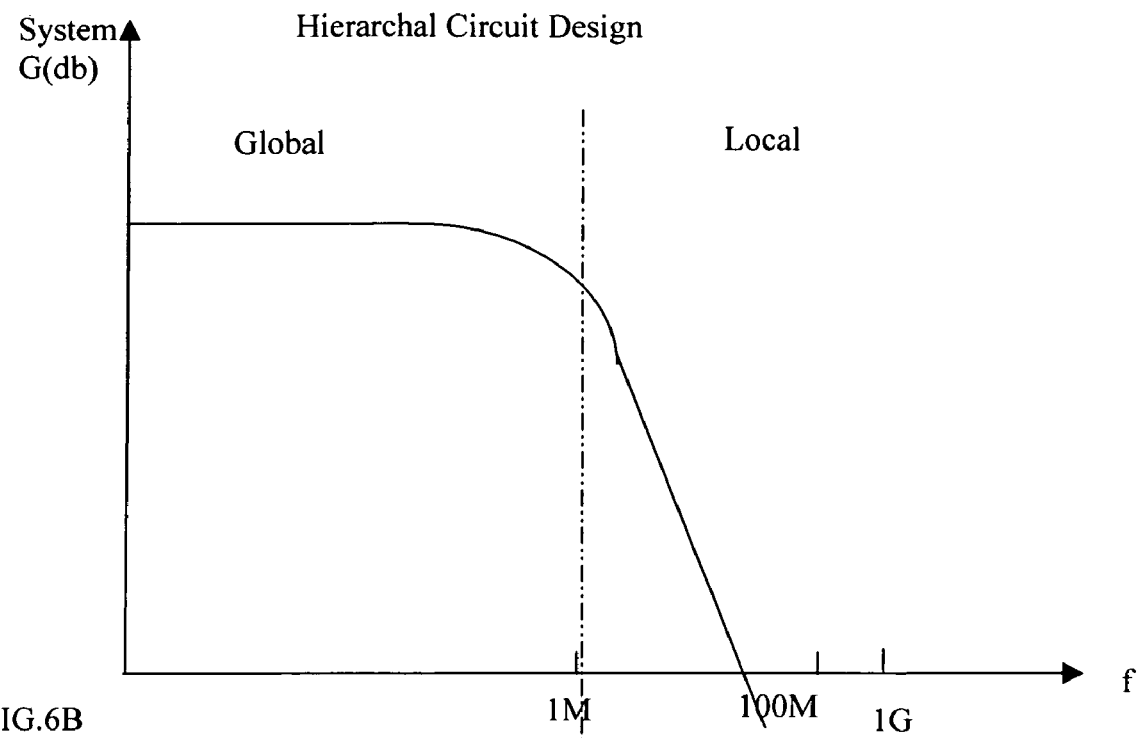
Figure 6C:
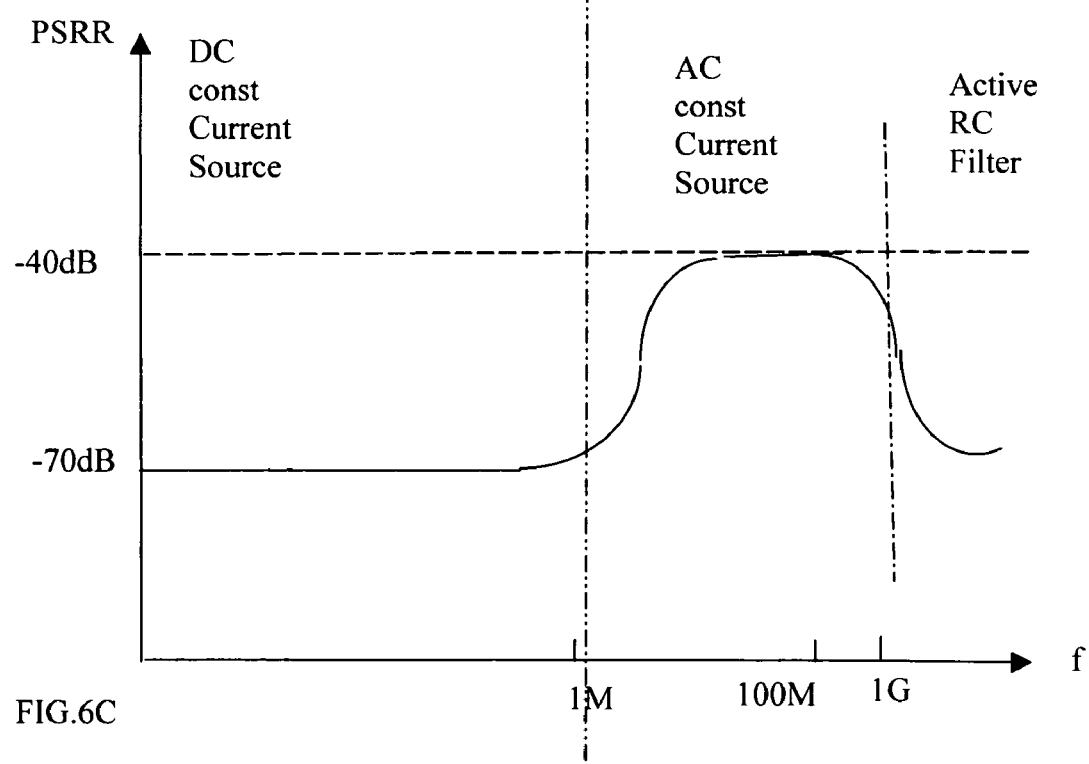
Figure 7A:
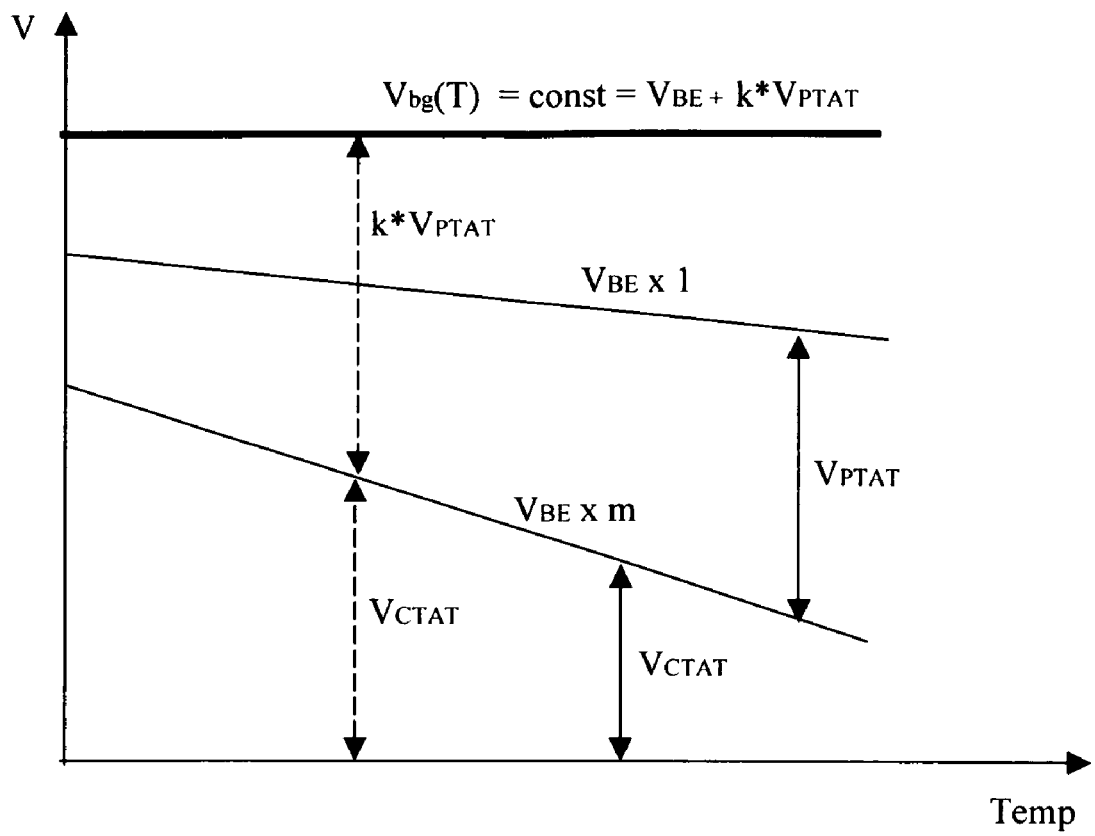
FIG. 7(A) is the Vbg, Vptat and Vctat graphical relation; (B) is the Ibg, Iptat and Ictat graphical relation.
Figure 7B:
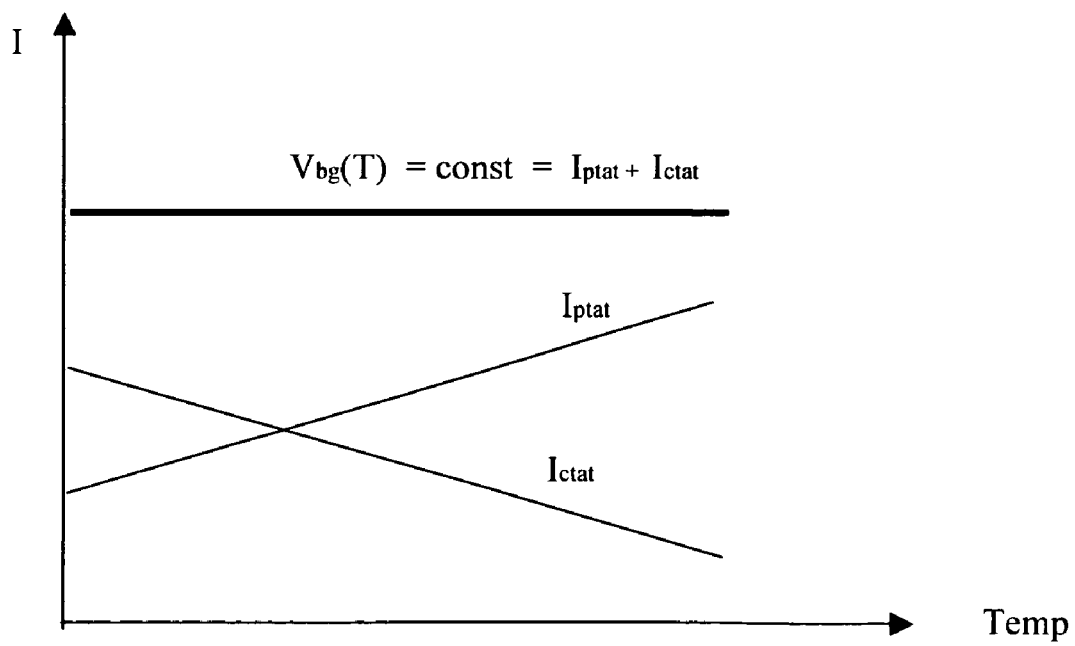

As shown in FIG. 6 and FIG. 7, PTAT is Proportional To Absolute Temperature; CTAT is Conjugate To Absolute Temperature where (x1) and (x m) is the scaling factor of the bipolar devices in bandgap reference circuit. The bandgap voltage reference is Vbg=Vptat+Vctat. The bandgap reference current is Ibg =k*(Iptat+Ictat) FIG. 6A is the circuit implementation of the graphic representation of the Vbg and Ibg in FIG. 7.

FIG. 6 shows the hierarchical circuit applied to the bandgap reference design. FIG. 6B shows the necessity of the partition of the bandgap reference circuit to be the hierarchical circuit. Due to the bandwidth limit of the OPAMP, the circuit is partitioned to be the global circuit and the local circuit. It is noted that the global level circuit is from the DC to the OPAMP bandwidth. The global circuit is served as the operating point of the higher frequency local circuit.

The OPAMP adopted the self-contained voltage regulator circuit configuration. It make the bandgap has the high PSRR. The bias voltages Vptat and Vctat are for the global control region. The capacitors Cap, Coca, Chi and Chi are for the local region of Meg Hz region. The RC filter Fp, FC and Fi are for the local region of GHz range.

As shown in FIG. 6B, the OPAMP has the bandwidth limit. In the bandwidth of the OPAMP, the circuit is global control. Outside the bandwidth of the OPAMP, the bandgap reference circuit is in the mode of local control. As shown in FIG. 6C of AC analysis of the PSRR, the local region is further divided to be two local regions: the constant source region and the noise-filtering region. It is the hierarchical design applied to the noise design.

From the AC analysis of the PSRR(Power Supply Reject Ratio), the global region has the PSRR about −70 dB. It means that as the VCC power supply varies from 2.9V to 3.7V, the Vbg is almost constant. It is V in the PVTAN analysis. The higher the gain of the OPAMP is, the better PSRR in the global region is.

In the region of Mega Hz region which is outside the bandwidth of the OPAMP, we see the PSRR raises about −20 dB region. We need uses the local circuit Cpa, Cpi, Cpc and Cci to keep the current source devices Mpp, Mpi, Mpc and Mci to be constant current source to suppress the PSRR from −20 dB to 40 dB. It is the constant source region.

For the Giga Hz region, we need the local circuit Fp, Fc and Fi to filter out the power supply noise. It is in the noise-filtering region.

In the derivation of the Vbg and Ibg, it is assumed that the input nodes of the OPAMP have the same voltage. The less deviation of the OPAMP input nodes voltage differences are, the better the Vbg and Ibg are. It is the reason why the high gain OPAMP 30 is adopted. Both the PTAT and CTAT circuit have the same circuit configuration. However, the offset voltage of the OPAMP causes the deviation of the ideal case. So the autozero circuit devices Mzp1, Mzp2, Mzp3 and Msp are adopted to autozero the total offset voltage of the whole bandgap circuit which includes the input offset voltage of the OPAMP 30.

Figure 8A:
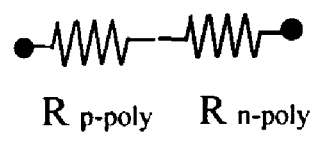
FIG. 8(A) is the voltage compensation resistor unit; (B) is the temperature compensation of resistor with the ratio of two resistor applying to the programmable gain amplifier.

Furthermore, in the bandgap circuit, the resistance needs to be both temperature compensated and voltage compensated. To have the better control over the temperature variation and voltage variation, as shown in FIG. 8, the resistors are both voltage compensated and temperature compensated. The p-poly resistor has the positive coefficient over the temperature range. As the temperature increases, the p-poly resistance increases. The n-poly resistor has the negative coefficient over the temperature range. As the temperature increases, the n-poly resistance decreases. FIG. 8A shows the combined resistor has the weighting p-poly resistor and the weighting n-poly resistor has the temperature coefficient (TC) to be 0. This is the unit resistance which has the constant resistance over the temperature range.

Figure 8B:
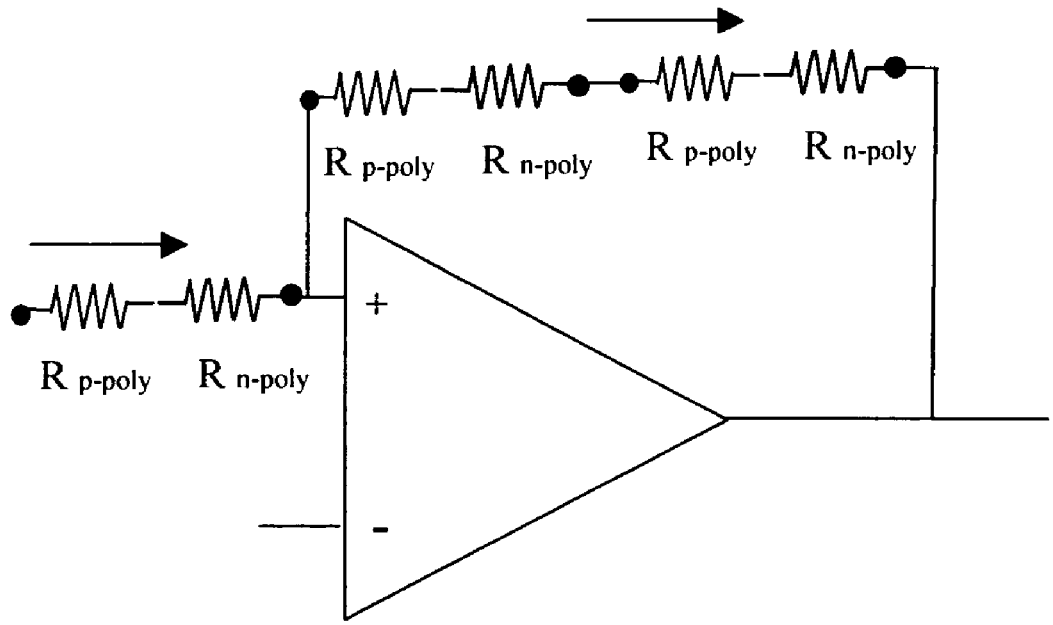

FIG. 8B shows the circuit configuration of the voltage compensated resistor which is made of the unit resistors. All the unit resistors are connected in series and have the same amount current passing through all the unit resistors. So the voltage differences between two ends of the resistors are the same. So, the voltage is compensated for all the unit resistors. For the variable gain amplifier, the voltage-temperature-compensated unit resistor can eliminate the harmonic distortion of the signal. For the bandgap reference circuit, the voltage-temperature-compensated unit resistor can have much better constant reference voltage Vbg and reference current Ibg.

Having the temperature and voltage compensated Vbg, Ibg and resistors, etc, then we can use the Vbg and Ibg to generate the fo from the oscillation tank 1. FIG. 12 shows the circuit implementation of the LC tank for the oscillation tank 1.

FIG. 9 shows the quality factor Q of the oscillator tank 1 can be increased with the IQ quadratic oscillator 8I and 8Q configuration. The LC oscillation tank is a filter. The oscillation of one tank 8I feeds the oscillation signal into the other oscillation tank 8Q and the oscillation signal is filtered by the other oscillation tank, and vice versa. The I and Q oscillation tanks mutually feed each other and mutually filtered by each other. This mutual-filtering process make the output oscillation signal has high Q.

Figure 10:
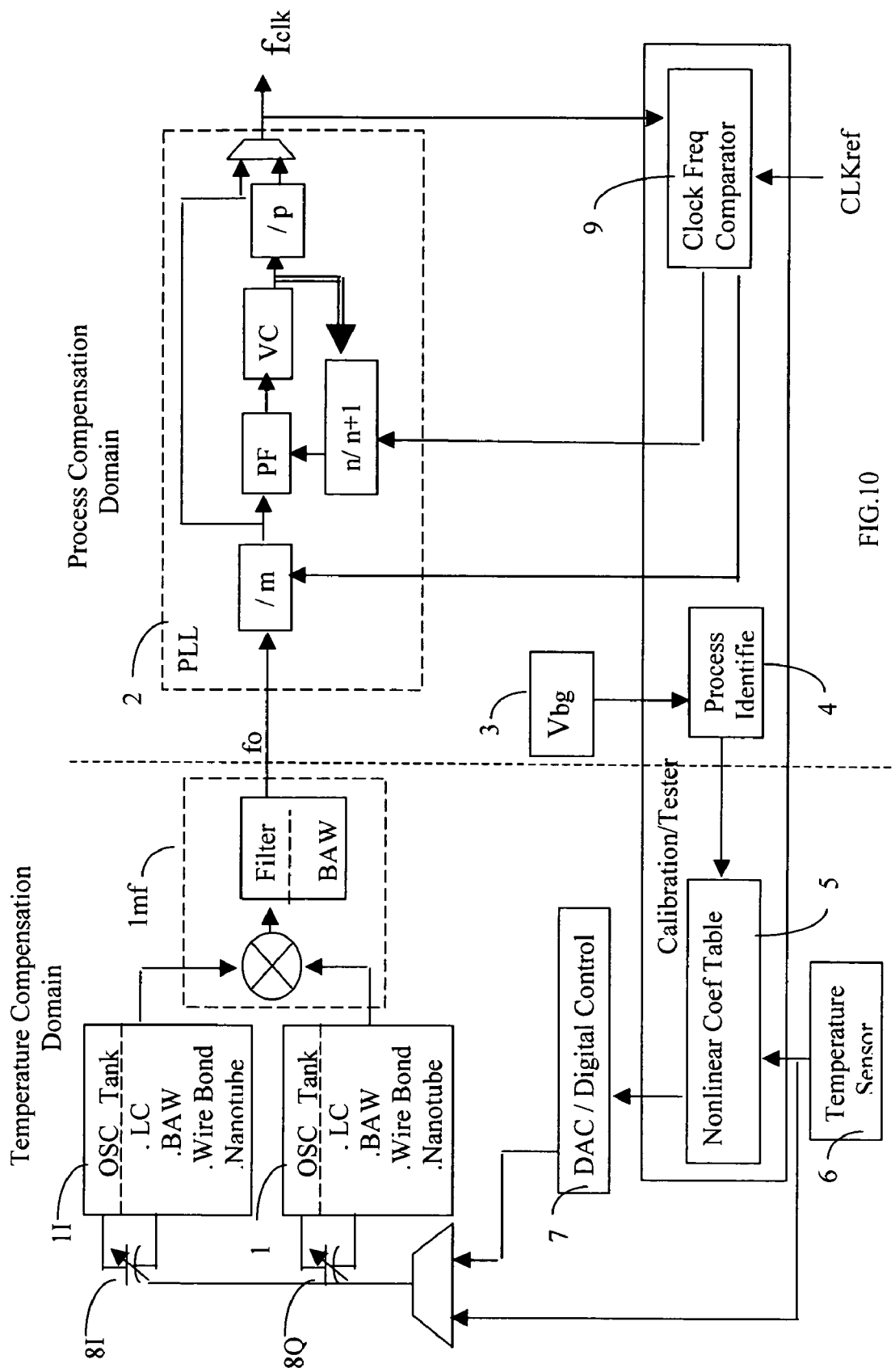
FIG. 10 is the block diagram of the XtalClkChip with the dual LCO having the aging capability.

FIG. 10 shows the dual oscillator circuit configuration can compensate for the aging of the oscillator tank. The oscillator 1I oscillates at frequency f1. The oscillator 1Q oscillates at frequency f2. The output frequency fo of the filtering mixer me is (f1−f2). The filter can be either low-pass filter or bandpass filter. Furthermore, the bandpass filter can be integrated with the mixer itself. The bandpass type circuit implementation of the filtering mixer 1mf is shown as FIG. 14.

FIG. 11 shows the hierarchical circuit with noise design circuit applying to the LDVR(Low Drop Voltage Regulator). FIG. 11A is the LDVR without the need of the compensation of the external capacitor. In the conventional LDVR design, they used the flat circuit design. They never use the hierarchical circuit design in the noise design style circuit. It is extremely difficult for the flat circuit design with solid power and ground design style engineers to understand the circuit designed by the hierarchical circuit design with noise circuit design style.

Figure 11A:
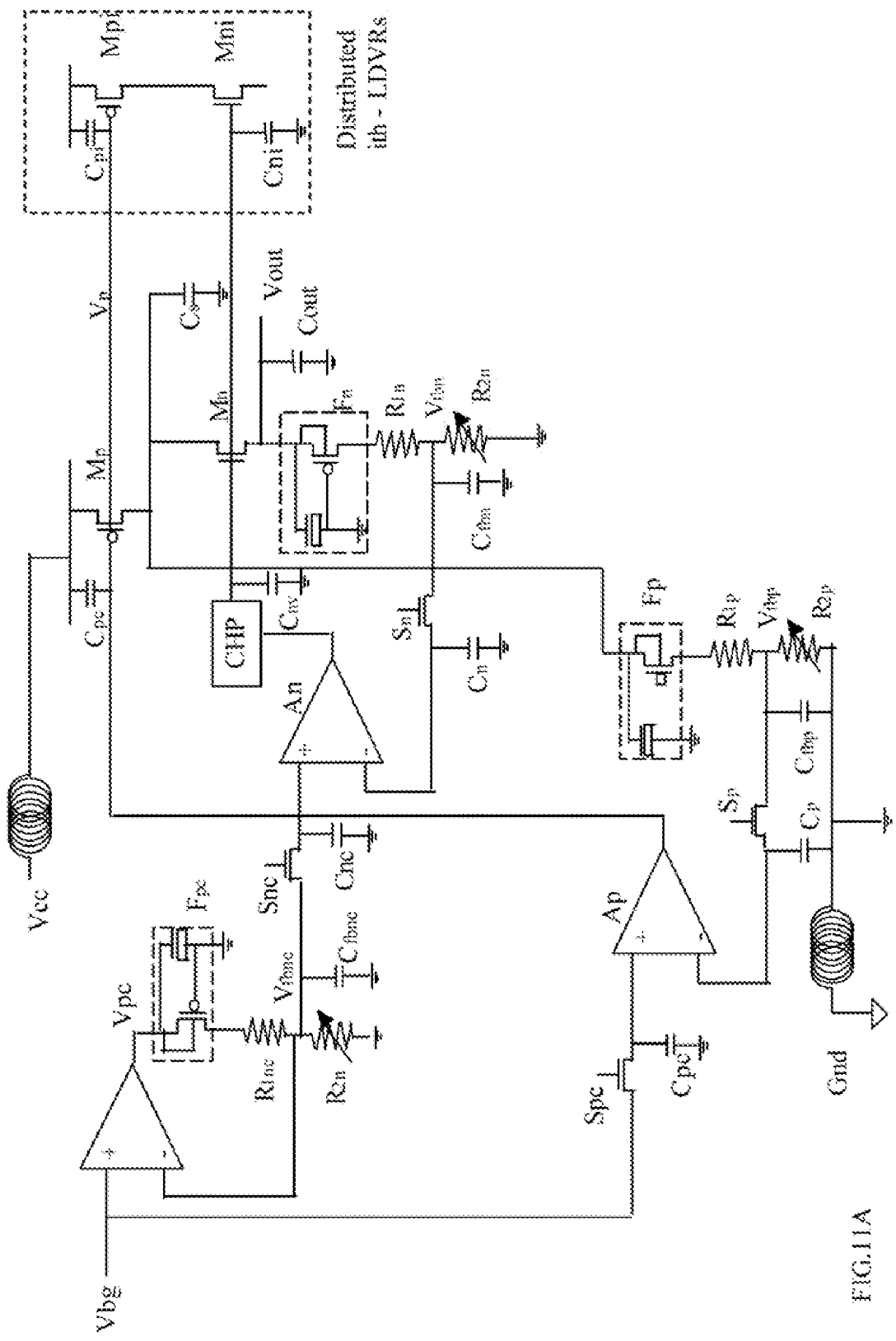
Figure 11B:
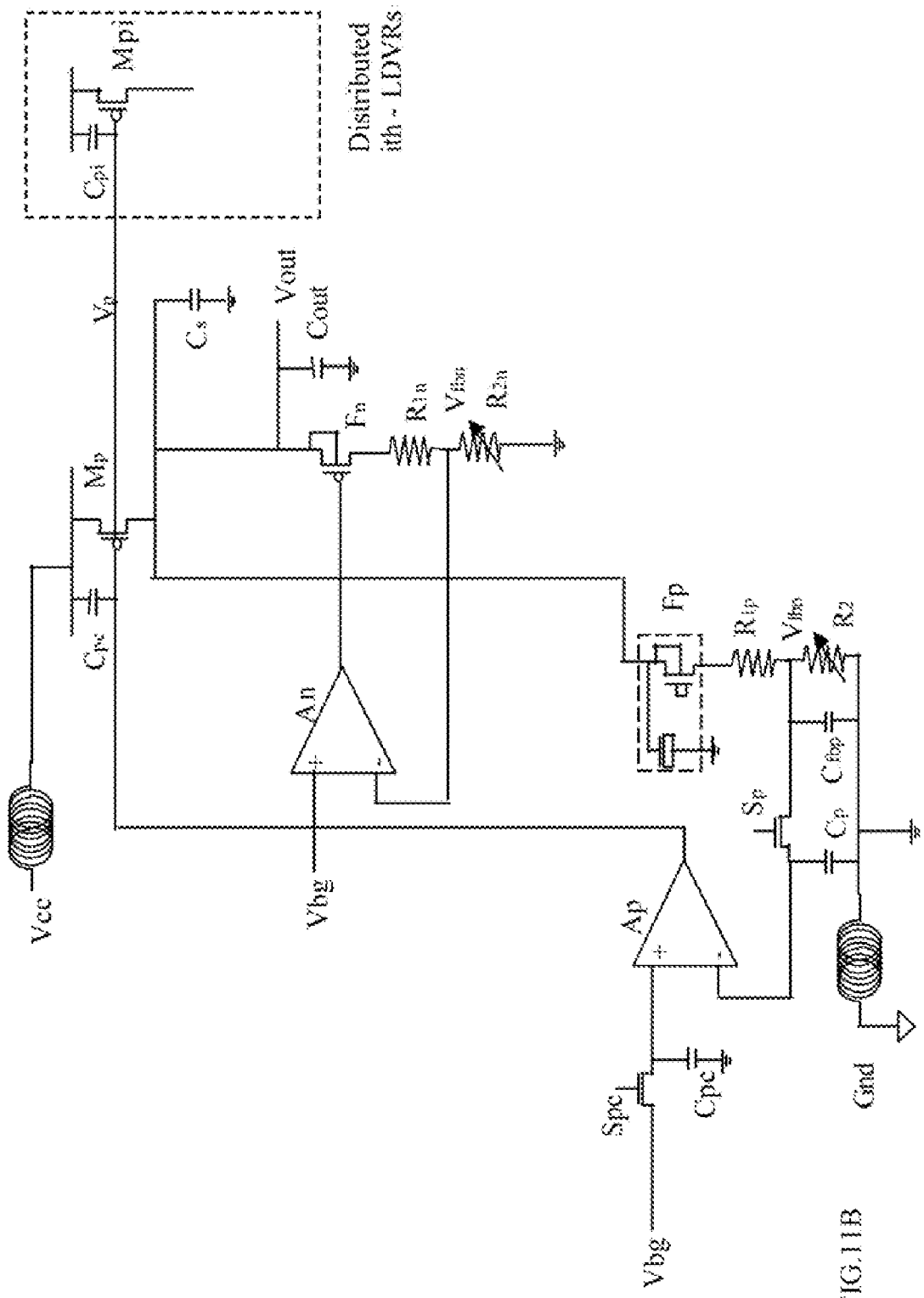
Figure 11C:
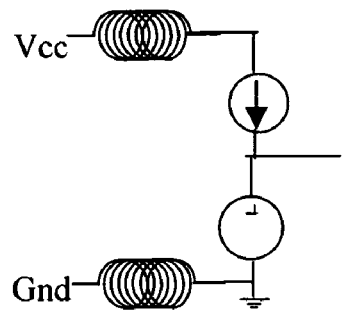
Figure 11D:
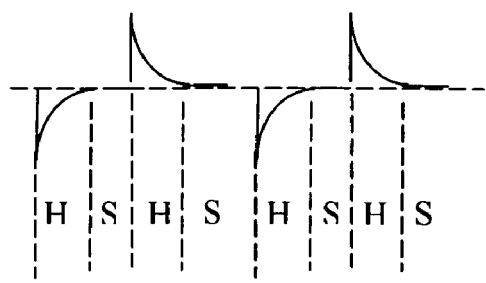

The other people's LDVR are based on the flat concept. So they use a lot of effort to boost up the OPAMP frequency response to have the higher bandwidth. Our LDVR uses the hierarchical circuit design to have the global circuit and the local circuit. As shown in FIG. 11A and FIG. 11D, there are the switch capacitor filter Sp and Cp to sample (S), hold (H), filter and average the feedback voltage $V_{fbp}$ and $V_{fbn}$ in the quite periods. The filter is a series of small filters instead of a giant external capacitor connected to the output node Vp. The filter Fp is to have much clean $V_{fbp}$ and $V_{fbn}$ signals. The switch capacitor can make the smart sample hold of the quite signal. The other flat circuit uses the giant external capacitor is equivalent to have the filter at the output node to filter the noise generated by the load. The hierarchical circuit uses much small smart switch capacitor to sample and hold the DC output voltage at the quite period. We use divide and conquer approach to divide the LDVR problem to be the global problem and the local problem. The global problem is to provide the constant current source to the output load. The local problem is to quench the noise generated by the output load. The local circuit is the NMOS device Mn to boost up the high frequency response.

The other flat circuit design engineers do not recognize the problem that the load will generate the violent noise. So the traditional flat circuit design applied to the LDVR design is completely wrong. The biggest gap is the concept gap. The hierarchical circuit design concept and the flat circuit design concept have a large concept gap.

Figure 11E:
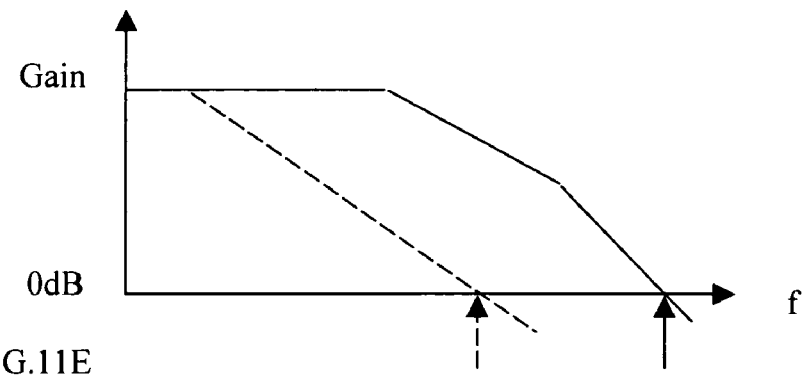
Figure 11F:
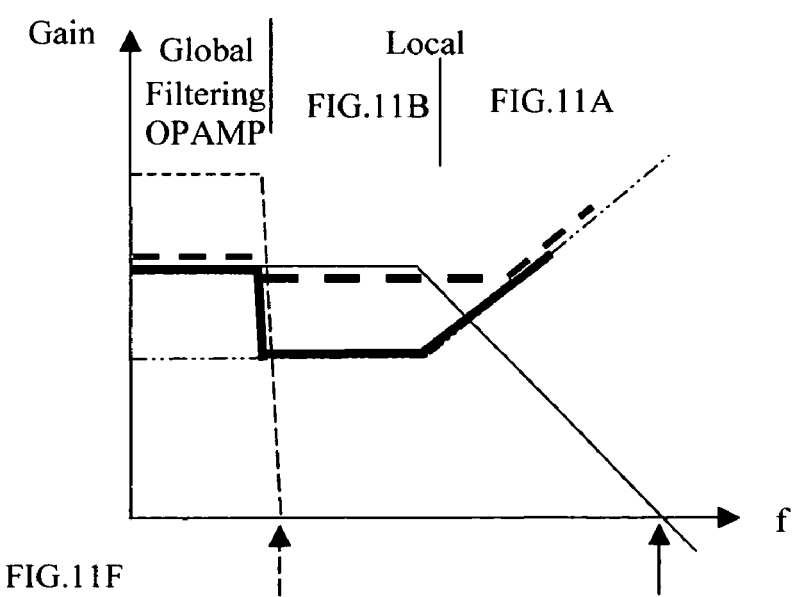

The OPAMP Ap and An had better to be the folding cascade OPAMP. The dominant pole is at the output nodes Vp or Vn. As shown in FIG. 11E, for the conventional flat circuit design of LDVR, they use two stage OPAMP, it definitely has the stability problem that they have to use the external cap and waste one single pin. Furthermore, they have to use the compensation capacitor. As shown in FIG. 11E, the role of the compensator is to move the 0 db point as shown by the arrows. As shown in FIG. 11F, the filter has the same effect as the compensation capacitor. The switch capacitor Sp and Cp not only can adjust for the resistance but also to sample the average at the quite time. With the smart use of the switch capacitor in the hierarchical circuit design, we can get rid of the external giant capacitor and have much superior performance. We use the hierarchical design with noise circuit design style. The filter chain has the same effect of the compensation capacitor.

Referring to FIG. 11A, the voltage source device Mn is biased at a constant voltage. If the output voltage Vn is higher than the supply voltage Vcc, then the charging pump CHP circuit is needed. Except the charge pumping circuit CHP, the feedback loop control circuit has the similar circuit configuration as the current source device Mp feedback loop control circuit.

Furthermore, even though we illustrate the complete circuit here, the LDVR circuit for Mp and Mn can share the resource to share the same circuit to simplify the design.

The hierarchical circuit design divides the frequency domain to be three ranges and each range has its circuit. The three ranges circuits cooperate to work together. As shown in FIG. 11F, the solid thick line is the curve for the FIG. 11A; the dotted thick line is the curve for the combination for FIG. 11A and FIG. 11B. FIG. 11B is for the LDVR circuit working in the middle Meg Hz range.

As shown in FIG. 11A, there are the distributed LDVRs. FIG. 12A is the LCO (LC Oscillator) with the embedded distributed LDVR circuit structure. With the embedded distributed LVDR, all the RF modules can have only one common LDVR and distributed LDVRs as shown in FIG. 11A. This embedded LDVRs of the power plan and noise plan make the XtalClkChip to have the solid P & G(Power and Ground).

Figure 12B:
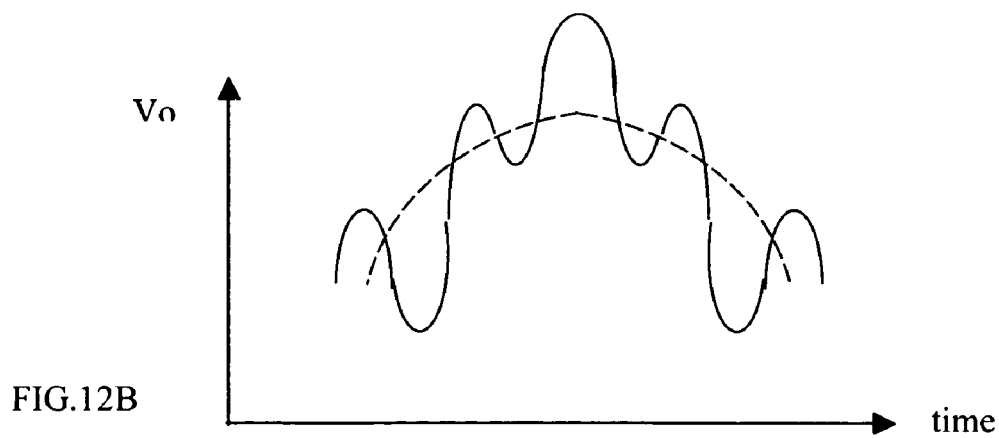

FIG. 12B shows the conventional LCO circuit having the ripple riding on the oscillation clock. This ripple is due to the current pulsing generated by the LCO flowing through the bonding wire Lvcc and Lgnd. So, for noise style circuit design, we have to get rid of the ripple.

As shown in FIG. 12A, the LCO has the LC tank lies in the middle portion of the back-to-back connected latch style circuit. Instead of flows through the Mp1, Mp2, Mn1 and Mn2, the current and energy of the LC tank are cycling horizontally. Ideally, only the biasing current flows through the Mp1, Mp2, Mn1 and Mn2 to supply a small amount oscillation sustaining energy. So, the noise impact on the bonding wire Lvcc and Lgnd is minimized and the ripple noise generated by the Lvcc and Lgnd is minimized.

At the common nodes vcom and gcom, there are the oscillation having the double frequency (2*fo) and out of phase 180 degrees. This double frequency (×2 fo) circuit is adopted this phenomena. However, the double frequency nodes voltage will feedback to the LCO and destroy the LCO performance. For the XtalClkChip, the LCO must have the idealized solid power and ground (P & G). The solid P & G is implemented with the embedded LDVR having the capacitor Conj shorting the conjugating nodes vcom and gcom. The oscillations at the conjugates nodes are 180 degrees out of phase and canceling each other.

However, no matter how large the capacitor Conj is, there are still has the ripples on the conjugate common nodes vcom and gcom. So we have the source follower devices Mcvn and Mcvp to move the double frequency (×2 fo) oscillation to the compensation nodes vcomp and gcomp. At the same time, the conjugate capacitor Conj can be reduced to gm times to be small capacitor (Conj/gm).

Mcip and Mcin are the current source type device. Mcvn and Mcvp are the voltage source type device. All the strong LCO tank oscillation is floating and circulating in the middle of the negative feedback mechanism.

Figure 12C:
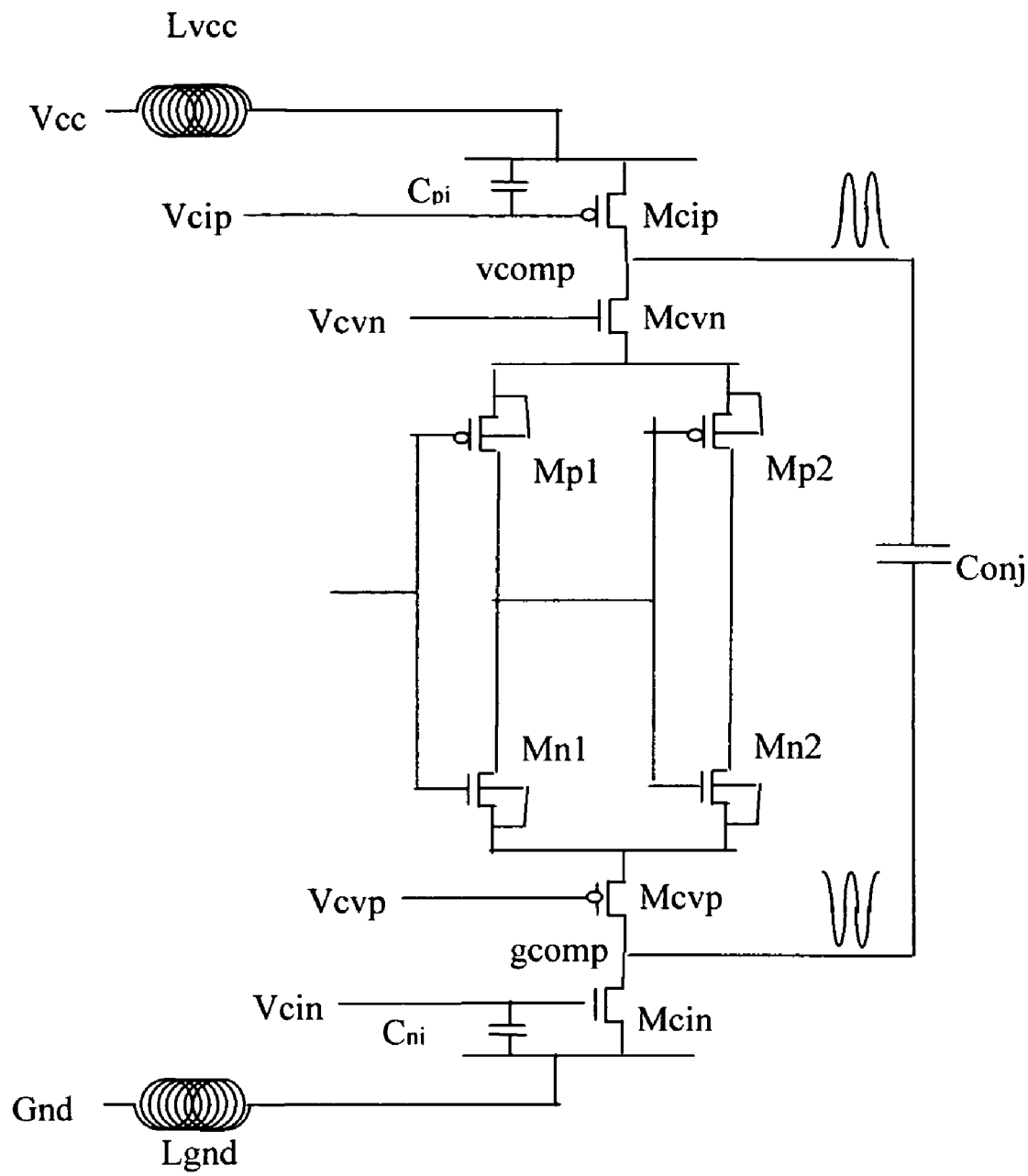

As shown in FIG. 12C, the LCO tank is replaced with the digital logic circuit. The digital circuit shares the same distributed LDVR as LCO tank does. So the LCO and digital circuit have the mechanism is similar to the nuclear core of the artificial sun. The noise generated by the LCO and digital circuit are isolated from each other. This is the power plan and noise plan for the RF SOC design in the XtalClkChip.

Figure 13A:
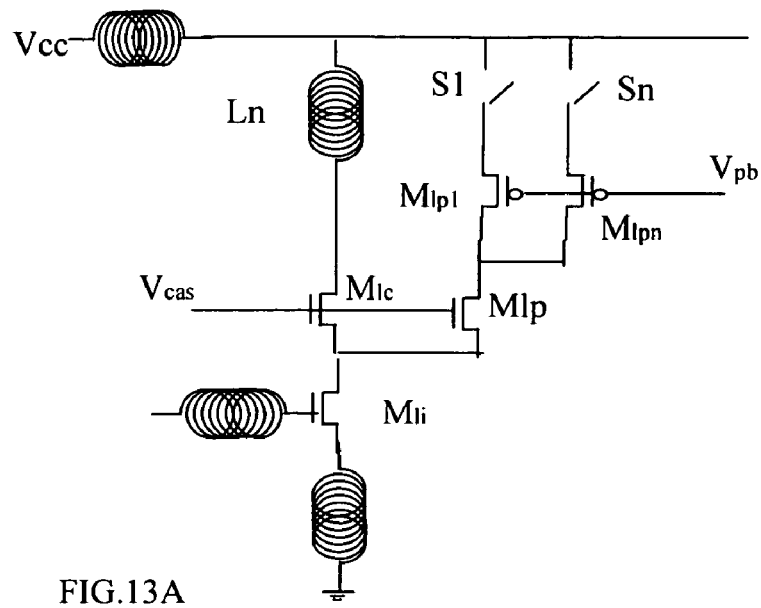
Figure 13B:
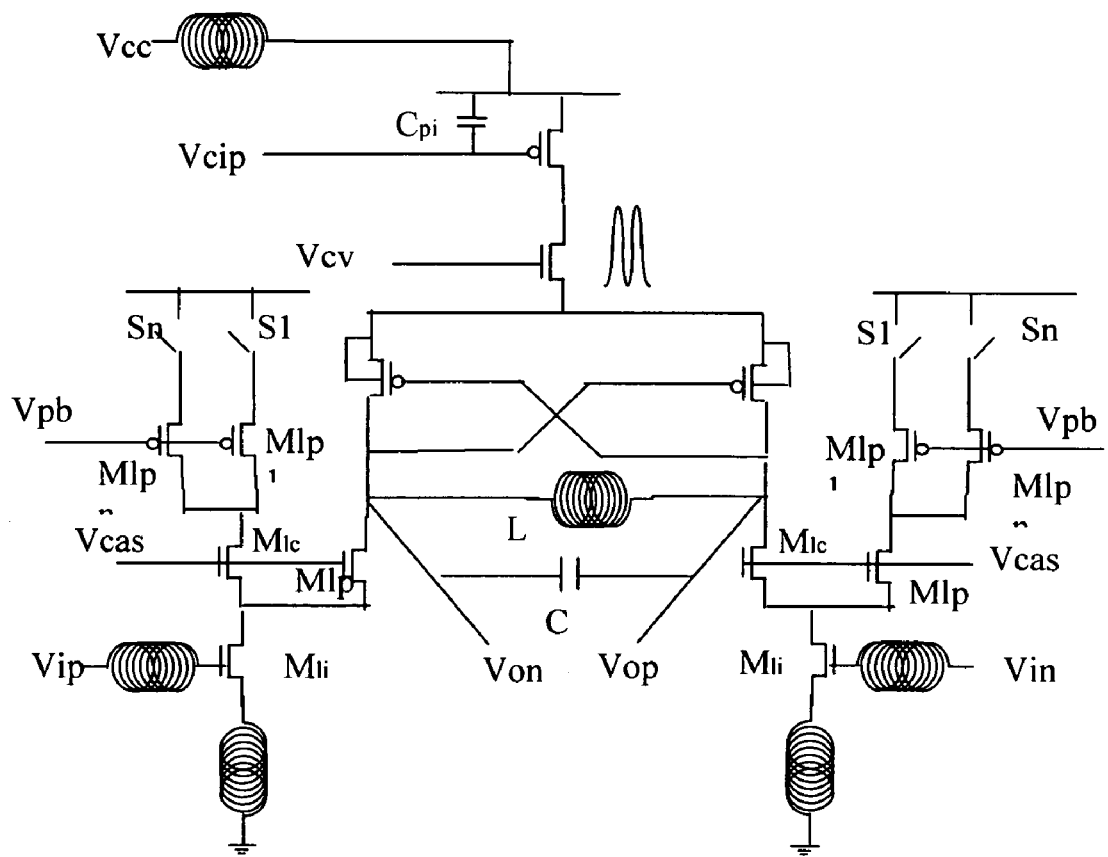

Since the XtalClkChip may have the high frequency clock direct interface, so the XtalClkChip have the programmable LNA (PLNA) as shown in FIG. 13. FIG. 13A is the basic single end circuit configuration of LNA. FIG. 13B is the hierarchical design noise style for differential end PGLNA design. The circuit configuration is to have the output active inductor load lying horizontally. The current and energy are circulating horizontally in the circuit instead of the vertically pumping on the power supply and ground. It reduces the chip noises.

As shown in FIG. 13A, for the impedance matching, the PLNA must have the constant impedance. So the current flows through the input device $M_{ji}$ must keep constant. We can adjust the current flowing through the load Ln to adjust gain of PLNA. The switch S1, Sn are the programmable switch to adjust the DC current injecting into the $M_{ji}$. The more DC current injecting into $M_{ji}$, the less gain of PLNA will be.

As shown in FIG. 14 is the filtering mixer which combines the mixer and filter function together. It saves the energy, layout area and reducing the noise. The input signal $V_{ilp}$ and $V_{iln}$ oscillate at frequency $f_1$. The input signal oscillates at frequency $f_2$. The LC tank oscillates at the $f_1-f_2$. So, in FIG. 14, the bottom portion is the traditional mixer, the upper portion is the LCO oscillator serving as the filter. As $f_1$ signal mixes with $f_2$ signal, two different frequencies signals will generate. The LCO filter will filter out the $(f_1+f_2)$ signal and amplifying the $(f_1-f_2)$ signal only.

FIG. 15 shows the power amplifier or the on-chip buffer having the LC tank energy circulating horizontally. The bottom is a differential input. The upper portion is the LC oscillator tank. We use the LC tank to pull and push the heavy out load. In this circuit configuration, the driving energy just circulates around and reusable. The energy doesn't flow into the ground and impact on the ground to make giant noise. It saves a lot of energy and reduces a lot of noise.

FIG. 16 shows the direct analog temperature compensation for the LC tank as shown in FIG. 1. Instead of going through the A/D, table, DAC or digital control path, the temperature sensor circuit makes the temperature compensation directly as the analog signal processor. FIG. 16B shows the principle of the temperature compensation. FIG. 16A is the implementation of the temperature compensation circuit. The inductor varies as the temperature changes. The temperature sensor circuit senses the variance of the temperature and varies the Vctrl signal to vary the capacitance. The variance of inductance is compensated with the variance of capacitance to have the output clock frequency $f_o$ to be constant. The gain of the variance of capacitance can be adjusted with the variance of R.

While the invention has been particularly shown and described with reference to the preferred embodiments thereof, it will be understood by those skilled in the art that various changes in form and details may be made therein without departing from the spirit and scope of the invention.

I claim:

1. A clock chip for clock generation having no crystal, comprising phase lock means and an on-chip first oscillator means including LC oscillator tank means, as the reference clock generator means, said first LC oscillator tank means being outside said phase lock means, further comprising an inductor means and a capacitor means, said first LC oscillator tank means delivering a reference clock to said phase lock means as a reference clock generator;

said phase lock means generating an output clock of which clock frequency being specified by customers, said phase lock means further including a second oscillator means, both said reference clock and said customized clock being inputs of said phase lock means to adjust oscillating frequency of said second oscillator means of said phase lock means to generate said customized clock with locking with frequency of said reference clock generator means of said first LC oscillator tank means.

2. The clock chip means according to claim 1, further comprising: hierarchical means for hierarchical circuit design, comprising global circuit means for whole circuit and local circuit means for individual circuit;

said global circuit means having amplifying means working in a low frequency range, said global circuit means offering biasing and operating points for said local circuit means;

said local circuit means working in high frequency responsive to said global circuit means biasing and operating points.

3. The clock chip means according to claim 1, further comprising: on-chip bonding capacitor means for bonding to a chip directly without bonding wire and having no parametric inductance of bonding wire, said on-chip capacitor means having two terminals connecting to two conductive contact means of said chip, said on-chip bonding capacitor means being mounted on said chip and making direct connection to said chip without bonding wire.

4. A clock chip means according to claim 1 wherein said inductor means being a bonding wire.

5. A clock chip means according to claim 1 wherein said inductor means being a bulk acoustic wave means.

6. A clock chip means according to claim 1 further comprising bandgap voltage reference means, said bandgap voltage reference means generating bandgap reference voltage to send to a calibration means to identify a process of said clock chip means.

7. A clock chip means according to claim 6 further comprising memory means according to said process, said memory means to keep memory of nonlinear table of said process.

8. A clock chip means according to claim 7 further comprising control means, said control means controlling capacitance of said capacitor to vary an oscillator frequency of said LC oscillation tank.

9. A clock chip means according to claim 1 said PLL means having adjusting parameters M, N and N+1, adjusting said parameters M, N and N+1, said PLL adjusting frequency of said output clock.

10. A clock chip means according to claim 9 further comprising an automatic calibration means, said automatic calibration means comparing frequency of said output clock with a reference clock to adjust said adjusting parameters M, N and N+1 automatically.

11. A clock chip means according to claim 9 said PLL means being fractional PLL means, said fractional PLL means adjusting the parameters to divide said output clock n times or n+1 times where n being one of said parameters.

12. A clock chip means according to claim 11 wherein said fractional PLL means being multi-phase fractional PLL means,
   said output clock varies with multi-phases as swapping of said dividing said output clock n times or n+1 times.

13. A clock chip means according to claim 9 said PLL means having spread-spectrum controlling means,
   said spread-spectrum controlling means controlling said parameters to vary frequency of said output clock.

14. A hierarchical circuit means according to claim 2 wherein said local circuit being one capacitor means,
   said capacitor means being connected between a power supply means and a current source type device means,
   a P type device means being biased by said global circuit means.

15. A hierarchical circuit means according to claim 2 wherein said local circuit being one filter means,
   said filter means being connected between a current source type device means and an output load means,
   said filter means filtering out noises in a power supply means from said output load means.

16. A hierarchical circuit means according to claim 14 further comprising a voltage source type local circuit means,
   said voltage source type local circuit means having drain terminal means connecting to drain terminal means of said current source type device;
   said voltage source type local circuit means having source terminal means connecting to an output node.

17. A hierarchical circuit means according to claim 16 having a LC tank load means,
   said output node being connected to a LC tank power supply node.

18. A hierarchical circuit means according to claim 16 having an output and buffer means and a programmable gain LNA,
   an output inductor of said programmable gain LNA being connected between a differential output nodes,
   said output and buffer means having an LC tank and reactive devices means and one differential input device means,
   said differential input device means driving said LC tank to oscillate to push and pull an output load.

19. A hierarchical circuit means according to claim 16 comprising a filtering mixer,
   said filter mixer comprising a filtering oscillator and a mixer means,
   said mixer means mixing two input signals,
   said filtering mixer having one LC tank which oscillating and filter one frequency of said mixer.

20. A clock chip means according to claim 1 comprising an analog temperature signal processing means,
   said analog temperature signal processing means sensing temperature and adjusting capacitance of said capacitor means;
   as inductance of said inductor varying with temperature, said adjusting capacitance varying to compensate to have constant oscillation frequency of said LC tank.

* * * * *